(12) United States Patent
Khlat et al.

(10) Patent No.: US 11,005,450 B2
(45) Date of Patent: May 11, 2021

(54) ACOUSTIC FILTER USING ACOUSTIC COUPLING

(71) Applicant: Qorvo US, Inc., Greensboro, NC (US)

(72) Inventors: Nadim Khlat, Cugnaux (FR); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 53 days.

(21) Appl. No.: 15/697,658

(22) Filed: Sep. 7, 2017

(65) Prior Publication Data

US 2018/0076794 A1     Mar. 15, 2018

Related U.S. Application Data

(60) Provisional application No. 62/385,340, filed on Sep. 9, 2016.

(51) Int. Cl.
*H03H 9/58* (2006.01)
*H03H 9/13* (2006.01)
(Continued)

(52) U.S. Cl.
CPC .......... *H03H 9/584* (2013.01); *H03H 9/0095* (2013.01); *H03H 9/13* (2013.01); *H03H 9/60* (2013.01)

(58) Field of Classification Search
CPC ............ H03H 9/0095; H03H 9/02007; H03H 9/02086; H03H 9/02125; H03H 9/02637;
(Continued)

(56) References Cited

U.S. PATENT DOCUMENTS 3,731,230 A  5/1973 Cerny, Jr.
3,875,533 A  4/1975 Irwin et al.
(Continued)

FOREIGN PATENT DOCUMENTS

JP    2012257050 A    12/2012

OTHER PUBLICATIONS

Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
(Continued)

*Primary Examiner* — Barbara Summons
(74) *Attorney, Agent, or Firm* — Withrow & Terranova, P.L.L.C.

(57) ABSTRACT

A filter circuit includes a first input node and a second input node for receiving an input signal, and a first output node and a second output node for providing an output signal. A first series acoustic resonator is coupled in series between the first input node and the first output node. At least one coupled resonator filter (CRF) includes first and second transducers, which may be acoustically coupled to one another. The first transducer has a first electrode coupled to the first input node, a second electrode coupled to the second input node, and a first piezoelectric layer between the first electrode and the second electrode. A second transducer has a third electrode coupled to the first output node, a fourth electrode coupled to the second output node, and a second piezoelectric layer between the third electrode and the fourth electrode.

29 Claims, 36 Drawing Sheets

(51) Int. Cl.
  *H03H 9/00* (2006.01)
  *H03H 9/60* (2006.01)
(58) Field of Classification Search
  CPC .. H03H 9/13; H03H 9/14502; H03H 9/14591; H03H 9/205; H03H 9/54; H03H 9/584; H03H 9/60
  USPC .................................................. 333/133, 189
  See application file for complete search history.

(56) References Cited

U.S. PATENT DOCUMENTS

| | | | |
|---|---|---|---|
| 4,442,434 A | 4/1984 | Baekgaard | |
| 4,577,168 A | 3/1986 | Hartmann | |
| 5,291,159 A | 3/1994 | Vale | |
| 6,067,391 A | 5/2000 | Land | |
| 6,670,866 B2 | 12/2003 | Ellaet et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson, III et al. | |
| 6,975,183 B2 | 12/2005 | Aigner et al. | |
| 7,057,478 B2* | 6/2006 | Korden | H03H 9/0095 333/189 |
| 7,173,504 B2* | 2/2007 | Larson, III | H03H 9/132 333/189 |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2* | 6/2008 | Larson, III | H03H 9/02102 333/189 |
| 7,436,269 B2* | 10/2008 | Wang | H03H 3/02 333/133 |
| 7,515,018 B2 | 4/2009 | Handtmann et al. | |
| 7,804,374 B1 | 9/2010 | Brown et al. | |
| 7,825,749 B2* | 11/2010 | Thalhammer | H03H 3/04 333/133 |
| 7,855,618 B2 | 12/2010 | Frank et al. | |
| 7,889,024 B2 | 2/2011 | Bradley et al. | |
| 7,898,493 B1 | 3/2011 | Rojas et al. | |
| 7,956,705 B2* | 6/2011 | Meister | H03H 9/0095 333/189 |
| 7,973,620 B2* | 7/2011 | Shirakawa | H03H 9/02228 330/124 R |
| 8,248,185 B2 | 8/2012 | Choy et al. | |
| 8,508,315 B2* | 8/2013 | Jamneala | H03H 9/587 310/334 |
| 8,575,820 B2 | 11/2013 | Shirakawa et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,243,316 B2 | 1/2016 | Larson, III et al. | |
| 9,484,883 B2 | 11/2016 | Nishizawa et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 2002/0109564 A1 | 8/2002 | Tsai et al. | |
| 2004/0100342 A1 | 5/2004 | Nishihara et al. | |
| 2005/0057117 A1 | 3/2005 | Nakatsuka et al. | |
| 2005/0093648 A1 | 5/2005 | Inoue | |
| 2005/0206476 A1* | 9/2005 | Ella | H03H 7/42 333/133 |
| 2006/0091978 A1* | 5/2006 | Wang | H03H 9/02228 333/189 |
| 2008/0007369 A1 | 1/2008 | Barber et al. | |
| 2008/0297278 A1 | 12/2008 | Handtmann et al. | |
| 2009/0096549 A1* | 4/2009 | Thalhammer | H03H 9/0004 333/189 |
| 2009/0096550 A1* | 4/2009 | Handtmann | H03H 9/0095 333/189 |
| 2010/0277237 A1 | 11/2010 | Sinha et al. | |
| 2011/0115334 A1 | 5/2011 | Konishi et al. | |
| 2011/0121689 A1 | 5/2011 | Grannen et al. | |
| 2011/0204995 A1 | 8/2011 | Jamneala et al. | |
| 2011/0210787 A1 | 9/2011 | Lee et al. | |
| 2012/0007696 A1* | 1/2012 | Pang | H03H 9/54 333/189 |
| 2012/0187799 A1 | 7/2012 | Nakahashi | |
| 2012/0313725 A1* | 12/2012 | Ueda | H03H 3/02 333/133 |
| 2013/0033150 A1 | 2/2013 | Bardong et al. | |
| 2013/0113576 A1* | 5/2013 | Inoue | H03H 9/6433 333/133 |
| 2013/0193808 A1 | 8/2013 | Feng et al. | |
| 2014/0132117 A1 | 5/2014 | Larson, III | |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0280100 A1 | 10/2015 | Burak et al. | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2019/0140618 A1 | 5/2019 | Takamine | |
| 2019/0199320 A1 | 6/2019 | Morita et al. | |
| 2019/0207583 A1 | 7/2019 | Miura et al. | |
| 2019/0288664 A1 | 9/2019 | Saji | |

OTHER PUBLICATIONS

De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.

Lakin, K. M., "Bulk Acoustic Wave Coupled Resonator Filters," International Frequency Control Symposium, 2002, IEEE, pp. 8-14.

Shirakawa, A. A., et al., "Bulk Acoustic Wave Coupled Resonator Filters Synthesis Methodology," European Microwave Conference, Oct. 4-6, 2005, Paris, France, IEEE, 4 pages.

Tosic, Dejan, et al., "Symbolic analysis of immitance inverters," 14th Telecommunications Forum, Nov. 21-23, 2006, Belgrade, Serbia, pp. 584-487.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

(56) References Cited

OTHER PUBLICATIONS

Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
U.S. Appl. No. 14/757,587, filed Dec. 23, 2015, now U.S. Pat. No. 9,698,756.
U.S. Appl. No. 15/004,084, filed Jan. 22, 2016.
U.S. Appl. No. 14/757,651, filed Dec. 23, 2015.
U.S. Appl. No. 15/275,957, filed Sep. 26, 2016.
U.S. Appl. No. 15/347,428, filed Nov. 9, 2016.
U.S. Appl. No. 15/347,452, filed Nov. 9, 2016.
U.S. Appl. No. 15/490,381, filed Apr. 18, 2017.
U.S. Appl. No. 15/586,374, filed May 4, 2017.
U.S. Appl. No. 15/644,922, filed Jul. 10, 2017.
U.S. Appl. No. 15/701,759, filed Sep. 12, 2017.
U.S. Appl. No. 15/720,706, filed Sep. 29, 2017.
U.S. Appl. No. 15/727,117, filed Oct. 6, 2017.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedance Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., ""Single-to-balanced Filters for Mobile Phones using Coupled Resonator BAW Technology,"" 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarishi et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Final Office Action for U.S. Appl. No. 15/883,933, dated Oct. 23, 2020, 15 pages.
Ibrahim, A. et al., "Compact Size Microstrip Couple Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Non-Final Office Action for U.S. Appl. No. 16/283,044, dated Nov. 12, 2020, 9 pages.
Advisory Action for U.S. Appl. No. 15/883,933, dated Dec. 31, 2020, 3 pages.
Non-Final Office Action for U.S. Appl. No. 16/290,175, dated Jan. 6, 2021, 14 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.

* cited by examiner

T-MODEL OF COMPENSATION CIRCUIT

π MODEL OF COMPENSATION CIRCUIT

ACOUSTIC FILTER USING ACOUSTIC COUPLING

RELATED APPLICATIONS

This application claims the benefit of provisional patent application Ser. No. 62/385,340, filed Sep. 9, 2016, the disclosure of which is hereby incorporated herein by reference in its entirety.

FIELD OF THE DISCLOSURE

The present disclosure relates to acoustic filters that employ acoustic resonators, and in particular to an enhanced acoustic filter using acoustic coupling.

BACKGROUND

Acoustic resonators, such as Surface Acoustic Wave (SAW) resonators and Bulk Acoustic Wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW- and BAW-based filters also have relatively low insertion loss, tend to decrease in size as the frequency of operation increases, and are relatively stable over wide temperature ranges.

As such, SAW- and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW- and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO), or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, whereas the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high-frequency filter networks, especially those operating at frequencies around 1.8 GHz and above.

Unfortunately, the phase ($\varphi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus of the spurious mode, in the passband of the phase curve, which resides between the series resonance frequency ($f_s$) and the parallel resonance frequency ($f_p$). Circle B shows suppression of the ripple, and thus of the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

As noted previously, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different from the first frequency response, as shown in FIG. 5B. In many applications, the shunt resonators $B_{SH}$ are detuned versions of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{p,SH}$) of the shunt resonators approximates the series resonance frequency ($f_{s,SER}$) of the series resonators $B_{SER}$. Note that the series resonance frequency ($f_{s,SH}$) of the shunt resonators $B_{SH}$ is less than the series resonance frequency ($f_{s,SER}$) of the series resonators $B_{SER}$. The parallel resonance frequency ($f_{p,SH}$) of the shunt resonators $B_{SH}$ is less than the parallel resonance frequency ($f_{p,SER}$) of the series resonators $B_{SER}$.

FIG. 5C is associated with FIG. 5B and illustrates the response of the ladder network 40. The series resonance frequency ($f_{s,SH}$) of the shunt resonators $B_{SH}$ corresponds to the low side of the passband's skirt (phase 2), and the parallel resonance frequency ($f_{p,SER}$) of the series resonators $B_{SER}$ corresponds to the high side of the passband's skirt (phase 4). The substantially aligned series resonance frequency ($f_{s,SER}$) of the series resonators $B_{SER}$ and the parallel resonance frequency ($f_{p,SH}$) of the shunt resonators $B_{SH}$ fall within the passband. FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{s,SH}$) of the shunt resonators $B_{SH}$ is approached, the impedance of the shunt resonators $B_{SH}$ drops precipitously such that the shunt resonators $B_{SH}$ essentially provide a short to ground at the series resonance frequency ($f_{s,SH}$) of the shunt resonators (phase 2, FIGS. 5C, 6B). At the series resonance frequency ($f_{s,SH}$) of the shunt resonators $B_{SH}$ (phase 2), the input signal is essentially blocked from the output of the ladder network 40.

Between the series resonance frequency ($f_{s,SH}$) of the shunt resonators $B_{SH}$ and the parallel resonance frequency ($f_{p,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, whereas the shunt resonators $B_{SH}$ present relatively high impedance, wherein the combination of the two leads to a flat passband with steep low- and high-side skirts. As the parallel resonance frequency ($f_{p,SER}$) of the series resonators $B_{SER}$ is approached, the impedance of the series resonators $B_{SER}$ becomes very high, such that the series resonators $B_{SER}$ essentially present themselves as open at the parallel resonance frequency ($f_{p,SER}$) of the series resonators (phase 4, FIGS. 5C, 6D). At the parallel resonance frequency ($f_{p,SER}$) of the series resonators $B_{SER}$ (phase 4), the input signal is again essentially blocked from the output of the ladder network 40.

During the final phase (phase 5, FIGS. 5C, 6E), the ladder network 40 functions to attenuate the input signal, in a similar fashion to that provided in phase 1. As the parallel resonance frequency ($f_{p,SER}$) of the series resonators $B_{SER}$ is passed, the impedance of the series resonators $B_{SER}$ decreases and the impedance of the shunt resonators $B_{SH}$ normalizes. Thus, the ladder network 40 functions to provide a high Q passband between the series resonance frequency ($f_{s,SH}$) of the shunt resonators $B_{SH}$ and the parallel resonance frequency ($f_{p,SER}$) of the series resonators $B_{SER}$. The ladder network 40 provides extremely high attenuation at both the series resonance frequency ($f_{s,SH}$) of the shunt resonators $B_{SH}$ and the parallel resonance frequency ($f_{p,SER}$) of the series resonators. The ladder network 40 provides good attenuation below the series resonance frequency ($f_{s,SH}$) of the shunt resonators $B_{SH}$ and above the parallel resonance frequency ($f_{p,SER}$) of the series resonators $B_{SER}$. As noted previously, there is a constant need to improve the performance of acoustic resonators and filters that are based thereon.

SUMMARY

In one embodiment, a filter circuit includes a first input node and a second input node for receiving an input signal, and a first output node and a second output node for providing an output signal. A first series acoustic resonator is coupled in series between the first input node and the first output node. At least one coupled resonator filter (CRF) includes first and second transducers, which may be acoustically coupled to one another. The first transducer has a first electrode coupled to the first input node, a second electrode coupled to the second input node, and a first piezoelectric layer between the first electrode and the second electrode. A second transducer has a third electrode coupled to the first output node, a fourth electrode coupled to the second output node, and a second piezoelectric layer between the third electrode and the fourth electrode. The at least one CRF may have a first CRF that includes the first transducer, the second transducer, and a first coupling structure between the first transducer and the second transducer, wherein the first transducer and the second transducer are vertically aligned such that the first coupling structure vertically acoustically couples the first transducer and the second transducer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

The accompanying drawing figures incorporated in and forming a part of this specification illustrate several aspects of the disclosure and, together with the description, serve to explain the principles of the disclosure.

DETAILED DESCRIPTION

Figure 1:
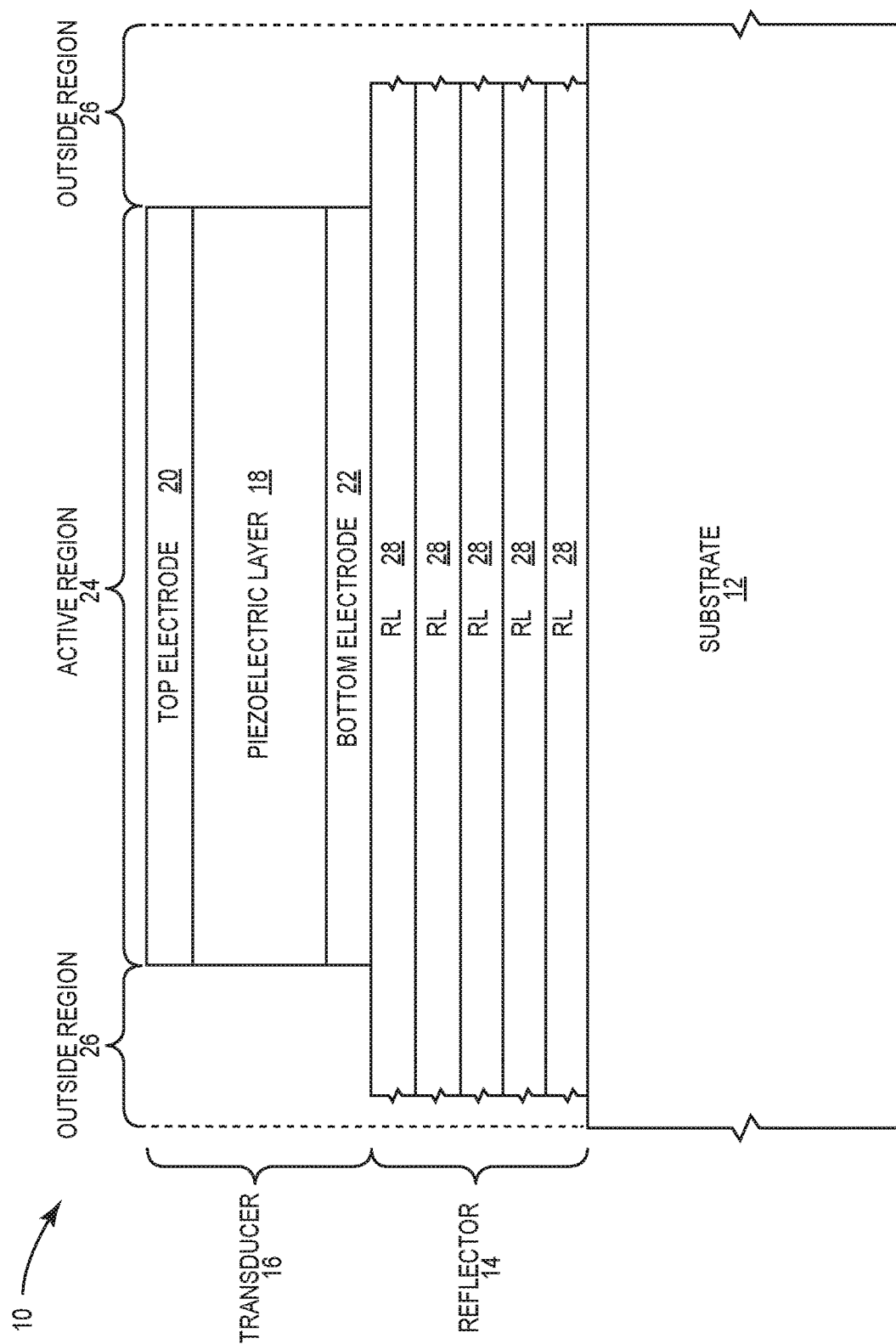
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed previously are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As defined herein, the term "coupled" without being preceded with the adjective "acoustically" refers to an electrical coupling as opposed to an acoustic coupling. The term "acoustically coupled" refers to an acoustic coupling as opposed to an electrical coupling. Further, the phrase "about the same as" when referring to the series resonance frequency of two or more devices means that the series resonance frequencies of the devices are within 0.1% of each other.

While the concepts provided herein are applicable to various technologies, these concepts are particularly useful in mobile terminals, such as mobile telephones, tablets, computers, and like smart devices. The following provides an overview of such devices. Today's mobile terminals must communicate using different communication technologies in different bands, which vary significantly in both bandwidth and frequency. To further complicate matters, data rates are ever increasing and the there is a need to transmit and receive over these different bands at the same time. As a result, mobile terminals have very complicated front-end configurations and are starting to employ multiple input multiple output (MIMO) transmission and reception technology, which requires the use of multiple antennas.

Figure 7:
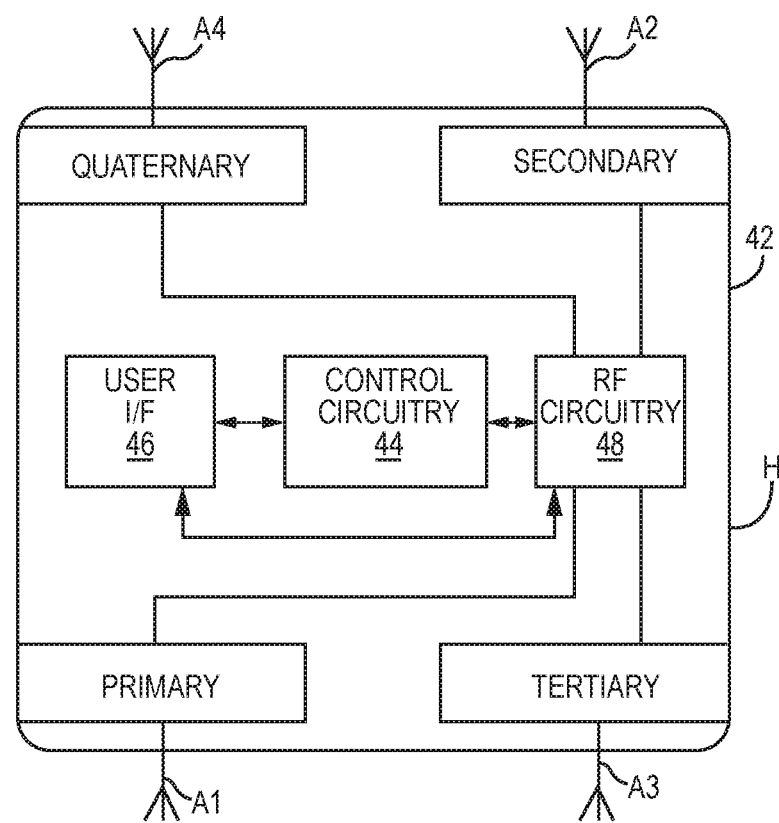
FIG. 7 is a block diagram of a mobile terminal according to one embodiment.

FIG. 7 is a block diagram of a mobile terminal 42 that incorporates four antennas: a primary antenna A1, a secondary antenna A2, a tertiary antennae A3, and a quaternary antenna A4. The mobile terminal 42 generally includes control circuitry 44, which is associated with a user interface (I/F) 46, and radio frequency (RF) circuitry 48. The user interface 46 may include microphones, speakers, keypads, touchscreens, displays, and the like. The RF circuitry 48 may include baseband, transceiver, power amplifier, and switching circuitry, as will be appreciated by those skilled in the art.

In general, signals to be transmitted are provided by the RF circuitry 48 to one or more of the antennas A1 through A4, and signals received by one or more of the antennas A1 through A4 are routed to the RF circuitry 48 for demodulation and associated processing. The RF circuitry 48 may be configured to facilitate any number of communications, including first, second, third, fourth, and fifth generation cellular communications, wireless local area network (WLAN) communications, Bluetooth communications, industrial, scientific and medical (ISM) communications, near field communications, and the like. Any of these communications may use MIMO for transmission, reception, or both, depending on the capabilities of the mobile terminal 42 and the systems with which the mobile terminal 42 communicates.

Since mobile terminals 42 are relatively small, the multiple antennas A1 through A4 used for MIMO are relatively close to one another. As a result, the antennas A1 through A4 may interact with one another, and as a result, modify each other's radiation patterns, which generally alters the antenna's radiation efficiency. With continued reference to FIG. 7, when the primary antenna A1 is used for transmission and the tertiary antennae A3 is used for reception at the same time, the transmission from antennae A1 may significantly degrade the ability to receive signals via antenna A3, given the proximity of antenna A1 to antenna A3. Further, the secondary antenna A2 and the quaternary antenna A4 may also be impacted by transmissions from the primary antenna A1. As such, there is a need for a cost effective and space efficient technique to resolve, or at least significantly reduce, the impact that one antenna has on another in devices such as the mobile terminal 42 illustrated in FIG. 7.

Figure 8:
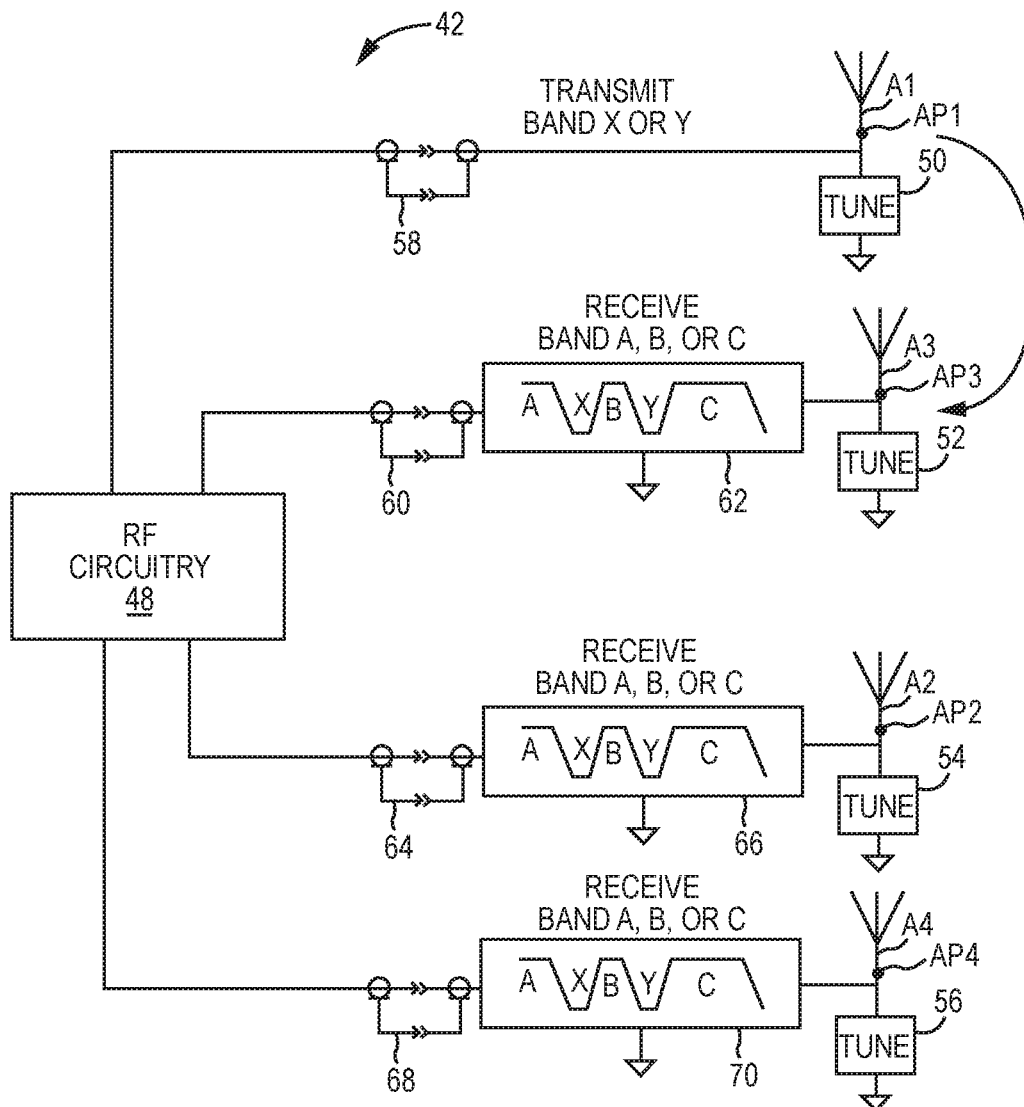
FIG. 8 is a schematic of an RF front-end according to a first embodiment.

With reference to FIG. 8, a technique for addressing the above issues is described. As illustrated, the RF circuitry 48 is associated with antennas A1 through A4. Each of the antennas is associated with antenna tuning circuitry 50, 52, 54, 56, respectively. In particular, antenna A1 is coupled to the RF circuitry 48 through coaxial cable 58. Antenna A3 is coupled to the RF circuitry 48 through coaxial cable 60 and a MPMS filter 62; antenna A2 is coupled to the RF circuitry 48 through coaxial cable 64 and MPMS filter 66; and antenna A4 is coupled to the RF circuitry 48 through coaxial cable 68 and MPMS filter 70. While MPMS filters 62, 66, and 70 are provided for antennas A3, A2, and A4, respectively, alternative embodiments may only employ MPMS filter 62, given the proximity of antennas A1 and A3. In other embodiments, an appropriately configured MPMS filter (not illustrated) may also be provided in association with antenna A1. In short, MPMS filters may be provided for each antenna A1 through A4 or any combination thereof. The antenna tuning circuitry 50, 52, 54, 56 are used for tuning impedances associated with the respective antennas A1, A3, A2, A4, as those skilled in the art will appreciate.

For the following description, MPMS filter 62 is described in detail; however, MPMS filter 66 and 70 may be similarly or identically configured, depending on the embodiment. Assume that the RF circuitry 48 is configured to transmit RF signals in band X and band Y via antenna A1 at the same or different times. Further assume that RF circuitry 48 is configured to receive RF signals and bands A, B, and C at the same or different times. Given the proximity of antennas A1 and A3, transmitting in bands X or Y via antenna A1 would significantly impact the ability of antenna A3 to receive RF signals in bands A, B, or C, in the absence of MPMS filter 62. However, adding MPMS filter 62 in close proximity to antenna A3 significantly reduces the impact that antenna A1 has on antenna A3.

MPMS filter 62 is a specially configured filter that has multiple passbands and multiple stopbands, which are interleaved with one another, as illustrated in FIG. 8. In this example, passbands are provided for bands A, B, and C and stopbands are provided for at least bands X and Y. A stopband for band X is between passbands for bands A and B, and a stopband for band Y is between passbands for bands B and C. In other words, stopbands are provided for the problematic bands that are transmitted via antenna A1, and passbands are provided for the bands to be received via antenna A3. The RF circuitry 48 may also transmit signals in bands A, B, or C via antenna A3. Providing stopbands for an adjacent antenna's transmission bands and passbands for the selected antenna's receive (and transmission) bands can significantly improve the performance of both antennas. When multiple ones of the MPMS filters 62, 66, 70 are employed, the passbands and stopbands may be the same or different amongst the different MPMS filters 62, 66, 70, based on the proximity of the antennas A1-A4 as well as the communication bands used for communications by the mobile terminal 42.

In certain embodiments, at least two of the stopbands and/or passbands provided by one or more of the MPMS filters 62, 66, 70 reside entirely above 2 GHz and have a bandwidth of at least 20 MHz. In other embodiments, at least two of the stopbands and/or passbands reside between 2 GHz and 12 GHz and have a bandwidth of at least 20 MHz, 40 MHz, 50 MHz, or 100 MHz. In select embodiments, at least one of the stopbands or passbands residing between two other stopbands or passbands has a bandwidth of at least 100 MHz, 150 MHz, or 200 MHz. All, or at least certain of, the stopbands may provide attenuation of at least 10 dB, 20 dB, or 30 dB in each of the above embodiments, depending on the configuration of the MPMS filters 62, 66, 70.

Figure 9:
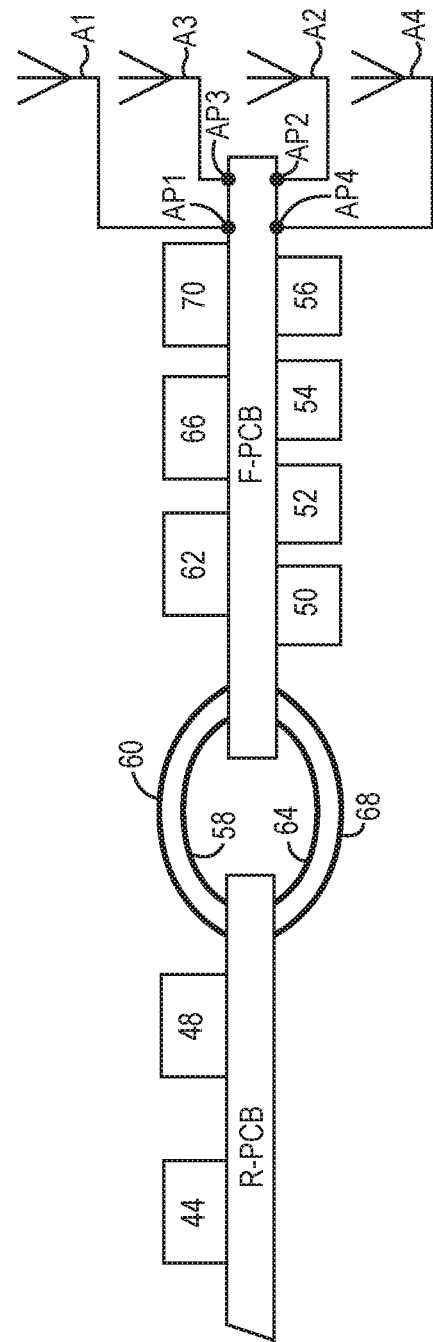
FIG. 9 illustrates a rigid PCB and a flexible PCB coupled together by multiple coaxial cables according to a first embodiment.

With reference to FIG. 9, the mobile terminal 42 may employ multiple printed circuit boards (PCBs) to implement the necessary electronics for operation. Further, the various antennas A1-A4 may be spread about the mobile terminal 42. These antennas A1-A4 may be implemented on or in a housing H (illustrated in FIG. 7) of the mobile terminal 42, on the various PCBs, or a combination thereof. FIG. 9 illustrates a rigid PCB (R-PCB) and a flexible PCB (F-PCB), which are used to implement at least part of the electronics for the mobile terminal 42. In one embodiment, the rigid PCB R-PCB may be a traditional glass-reinforced multilayer circuit board, wherein the flexible PCB F-PCB is provided by a much thinner, flexible substrate on which traces and components may be formed or mounted. The flexible PCB F-PCB will have a flex factor of at least ten times that of the rigid PCB R-PCB.

As illustrated, the control circuitry 44 and the RF circuitry 48 are implemented in whole or in part on the rigid PCB R-PCB while the MPMS filters 62, 66, 70 and the antenna tuning circuitry 50, 52, 54, 56 are implemented on the flexible PCB F-PCB. The coaxial cables 58, 60, 64, 68 connect the rigid PCB R-PCB and the flexible PCB F-PCB such that the transmit/receive paths that extend between the RF circuitry 48 and the respective antennas A1, A2, A3, and A4 are provided by the combination of the rigid PCB R-PCB, the flexible PCB F-PCB, and the coaxial cables 58, 60, 64, 68. These transmit/receive paths extend to corresponding antenna ports AP1, AP2, AP3, AP4 of the flexible PCB F-PCB. The antennas A1, A2, A3, and A4 are connected to the antenna ports AP1, AP2, AP3, AP4, respectively, through cables, traces, and/or the like.

Figure 10:
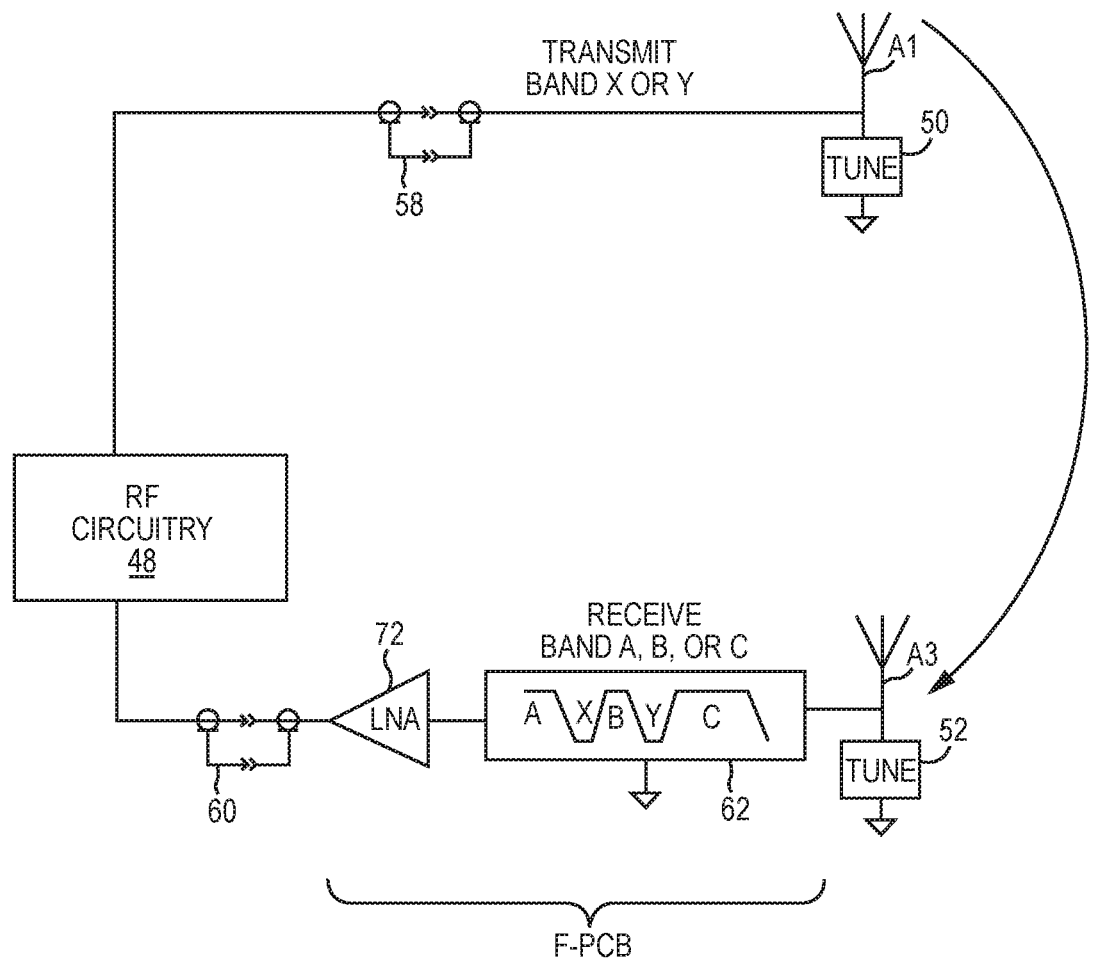
FIG. 10 is a schematic of an RF front-end according to a second embodiment.

With reference to FIG. 10, a low noise amplifier (LNA) 72 may be provided between the MPMS filter 62 and the coaxial cable 60 to amplify the filtered receive signals prior to the coaxial cable 60. The LNA 72 may be provided along with the MPMS filter 62 on the flexible PCB F-PCB, wherein the RF circuitry 48 is provided on the rigid PCB R-PCB, and the coaxial cable 60 connects the flexible PCB F-PCB and the rigid PCB R-PCB. The antenna tuning circuitry 50, 52 may also be provided on the flexible PCB F-PCB.

The following provides various filters that employ acoustic resonators and are capable of providing a filter response that includes multiple passbands and stopbands. Some basics regarding the theory of operation are provided prior to describing the specific configurations, which provide the desired filter responses.

Figure 11:
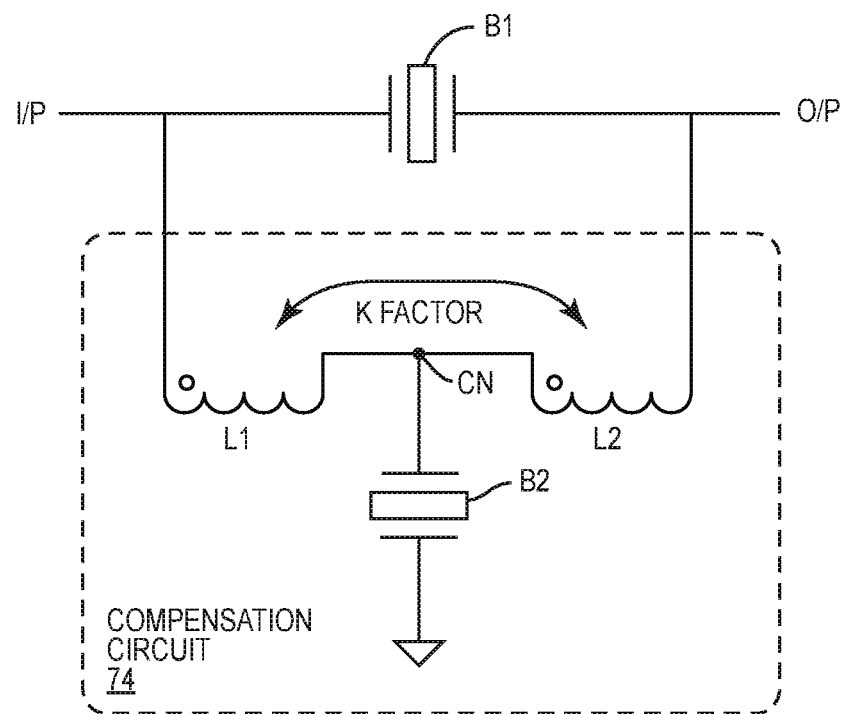
FIG. 11 illustrates an acoustic resonator in parallel with a compensation circuit, which includes a single shunt acoustic resonator.

Turning now to FIG. 11, a series resonator B1 is shown coupled between an input node I/P and an output node O/P. The series resonator B1 has a series resonance frequency $F_s$ and inherent capacitance, which generally limits the bandwidth of filters that employ the series resonator B1. In the case of a Bulk Acoustic Wave (BAW) resonator, the capacitance of the series resonator B1 is primarily caused by its inherent structure, which looks and acts like a capacitor in part because the series resonator includes the top and bottom electrodes 20, 22 (FIG. 1) that are separated by a dielectric piezoelectric layer 18. While BAW resonators are the focus of the example, other types of acoustic resonators, such as Surface Acoustic Wave (SAW) resonators, are equally applicable.

A compensation circuit 74 is coupled in parallel with the series resonator B1 and functions to compensate for some of the capacitance presented by the series resonator B1. The compensation circuit 74 includes two negatively coupled inductors L1, L2 and a shunt resonator B2. The inductors L1, L2 are coupled in series between the input node I/P and the output node O/P, wherein a common node CN is provided between the inductors L1, L2. The inductors L1, L2 are magnetically coupled by a coupling factor K, wherein the dots illustrated in association with the inductors L1, L2 indicate that the magnetic coupling is negative. As such, the inductors L1, L2 are connected in electrical series and negatively coupled from a magnetic coupling perspective. As defined herein, two (or more) series-connected inductors that are negatively coupled from a magnetic perspective are inductors that are:

connected in electrical series; and
the mutual inductance between the two inductors functions to decrease the total inductance of the two (or more) inductors.

The shunt resonator B2 is coupled between the common node CN and ground, or other fixed voltage node.

Figure 2:
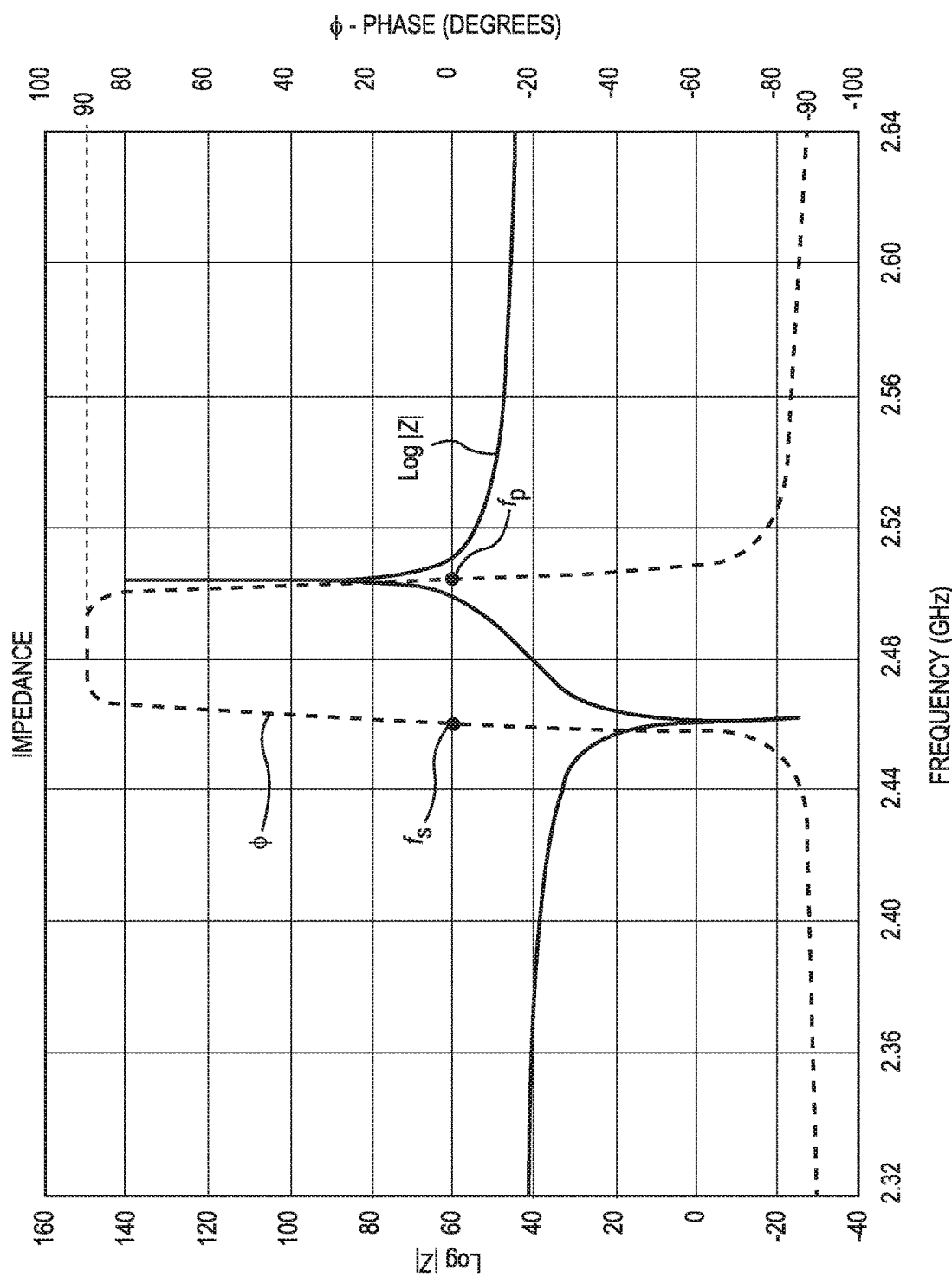
FIG. 2 is a graph of the magnitude and phase of impedance over frequency responses as a function of frequency for an ideal BAW resonator.
Figure 3:
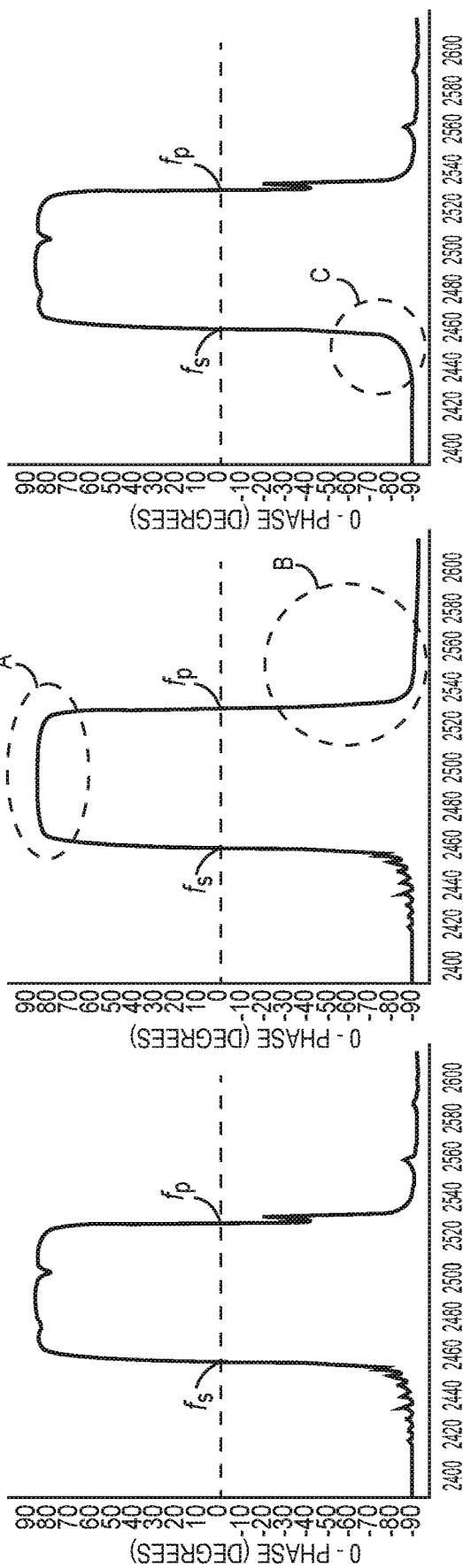
FIGS. 3A-3C are graphs of phase responses for various BAW resonator configurations.
Figure 4:
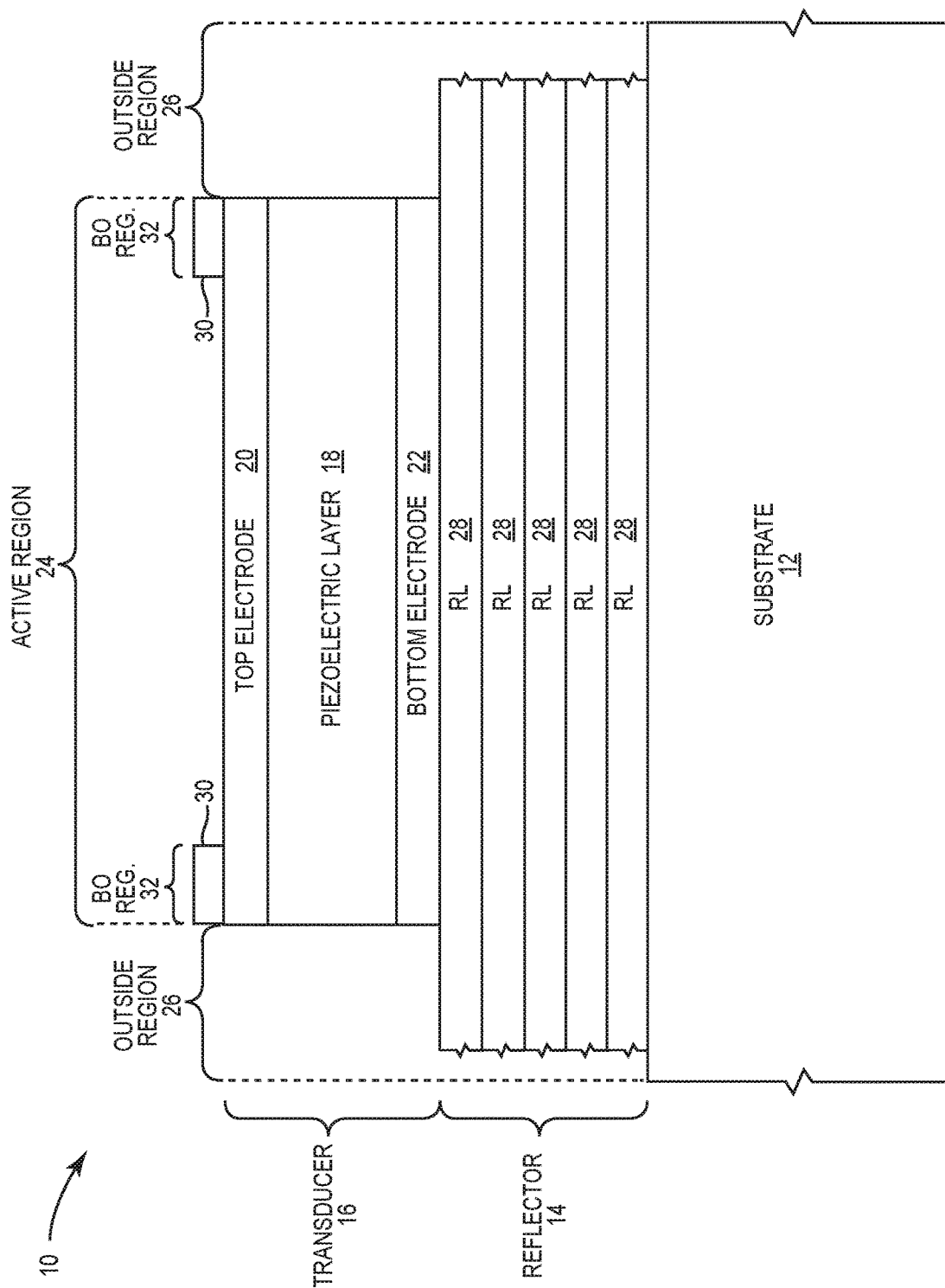
FIG. 4 illustrates a conventional BAW resonator with a border ring.

To compensate for at least some of the capacitance of the series resonator B1, the compensation circuit 74 presents itself as a negative capacitance within certain frequency ranges when coupled in parallel with the series resonator B1. Since capacitances in parallel are additive, providing a negative capacitance in parallel with the (positive) capacitance of the series resonator B1 effectively reduces the capacitance of the series resonator B1. With the compensation circuit 74, the series resonator B1 can actually function as a filter (instead of just a resonator) and provide a passband, albeit a fairly narrow passband, instead of a more traditional resonator response (solid line of FIG. 2).

Figure 12:
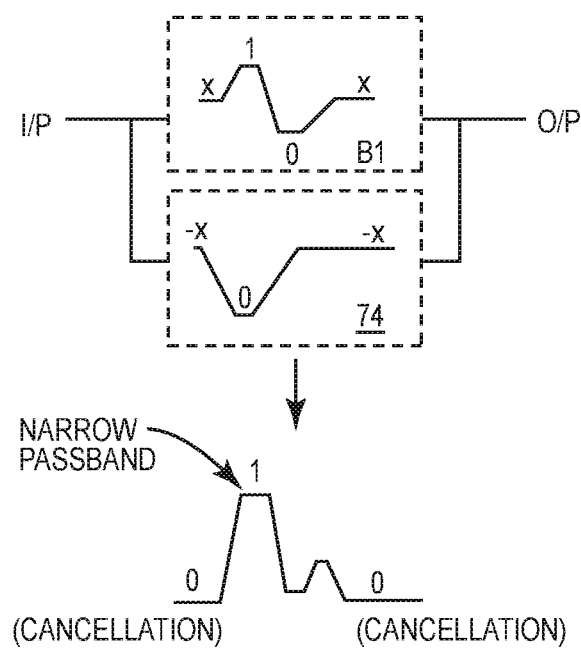
FIG. 12 is a graph that illustrates exemplary frequency responses for the acoustic resonator, compensation circuit, and overall circuit of FIG. 11.

FIG. 12 graphically illustrates the frequency responses of the series resonator B1 (inside the block referenced B1), the compensation circuit 74 (inside the block referenced 74), and the overall circuit in which the compensation circuit 74 is placed in parallel with the series resonator B1. As illustrated, the overall circuit provides a relatively narrow passband. Further detail on this particular circuit topology can be found in the co-assigned U.S. patent application Ser. No. 15/004,084, filed Jan. 22, 2016, now patented as U.S. Pat. No. 9,837,984 on Dec. 5, 2017, and titled RF LADDER FILTER WITH SIMPLIFIED ACOUSTIC RF RESONATOR PARALLEL CAPACITANCE COMPENSATION, and U.S. patent application Ser. No. 14/757,651, filed Dec. 23, 2015, now patented as U.S. Pat. No. 10,333,494 on Jun. 25, 2019, and titled SIMPLIFIED ACOUSTIC RF RESONATOR PARALLEL CAPACITANCE COMPENSATION, the disclosures of which are incorporated herein by reference in their entireties.

While beneficial in many applications, the narrow passband of the circuit topology of FIG. 11 has its limitations. With the challenges of modern day communication systems, wider passbands and the ability to provide multiple passbands within a given system are needed. Fortunately, applicants have discovered that certain modifications to this topology provide significant and truly unexpected increases in passband bandwidths and, in certain instances, the ability to generate multiple passbands of the same or varying bandwidths in an efficient and effective manner.

Figure 13:
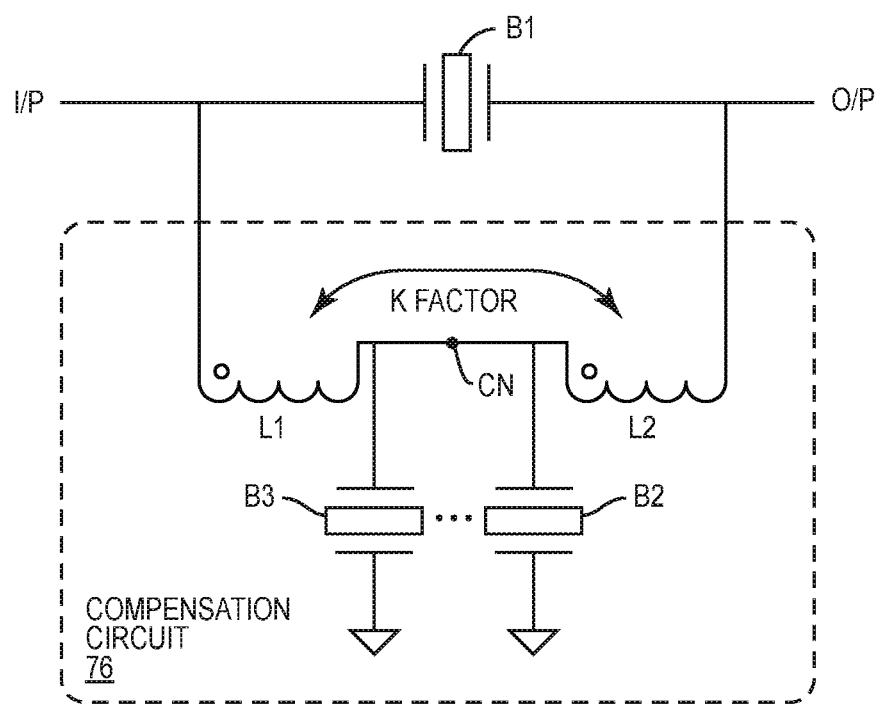
FIG. 13 illustrates an acoustic resonator in parallel with a compensation circuit, which includes at least two shunt acoustic resonators, according to a first embodiment.

With reference to FIG. 13, a modified circuit topology is illustrated wherein the circuit topology of FIG. 11 is modified to include an additional shunt resonator B3, which is coupled between the common node CN and ground. As such, a new compensation circuit 76 is created that includes the negatively coupled inductors L1 and L2, which have a coupling coefficient K, and at least two shunt resonators B2, B3. The compensation circuit 76 is coupled in parallel with the series resonator B1. When the series resonance frequencies $F_s$ of the shunt resonators B2, B3 are different from one another, unexpectedly wide bandwidths passbands are achievable while maintaining a very flat passbands, steep skirts, and excellent cancellation of signals outside of the passbands.

Figure 14:
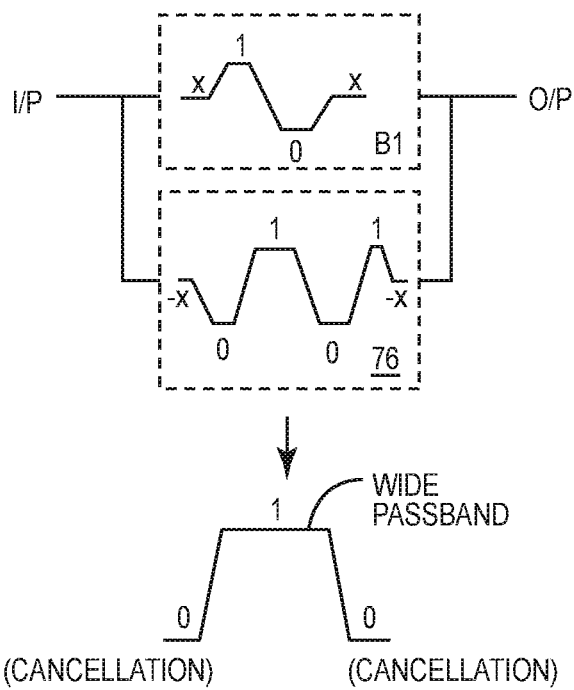
FIG. 14 is a graph that illustrates exemplary frequency responses for the acoustic resonator, compensation circuit, and overall circuit of FIG. 13.

FIG. 14 graphically illustrates the frequency responses of the series resonator B1 (inside the block referenced B1), the compensation circuit 76 (inside the block referenced 76), and the overall circuit in which the compensation circuit 76 is placed in parallel with the series resonator B1. As illustrated, the overall circuit with the compensation circuit 76 provides a much wider passband (FIG. 10) than the overall circuitry with the compensation circuit 74 (FIG. 12).

Figure 15:
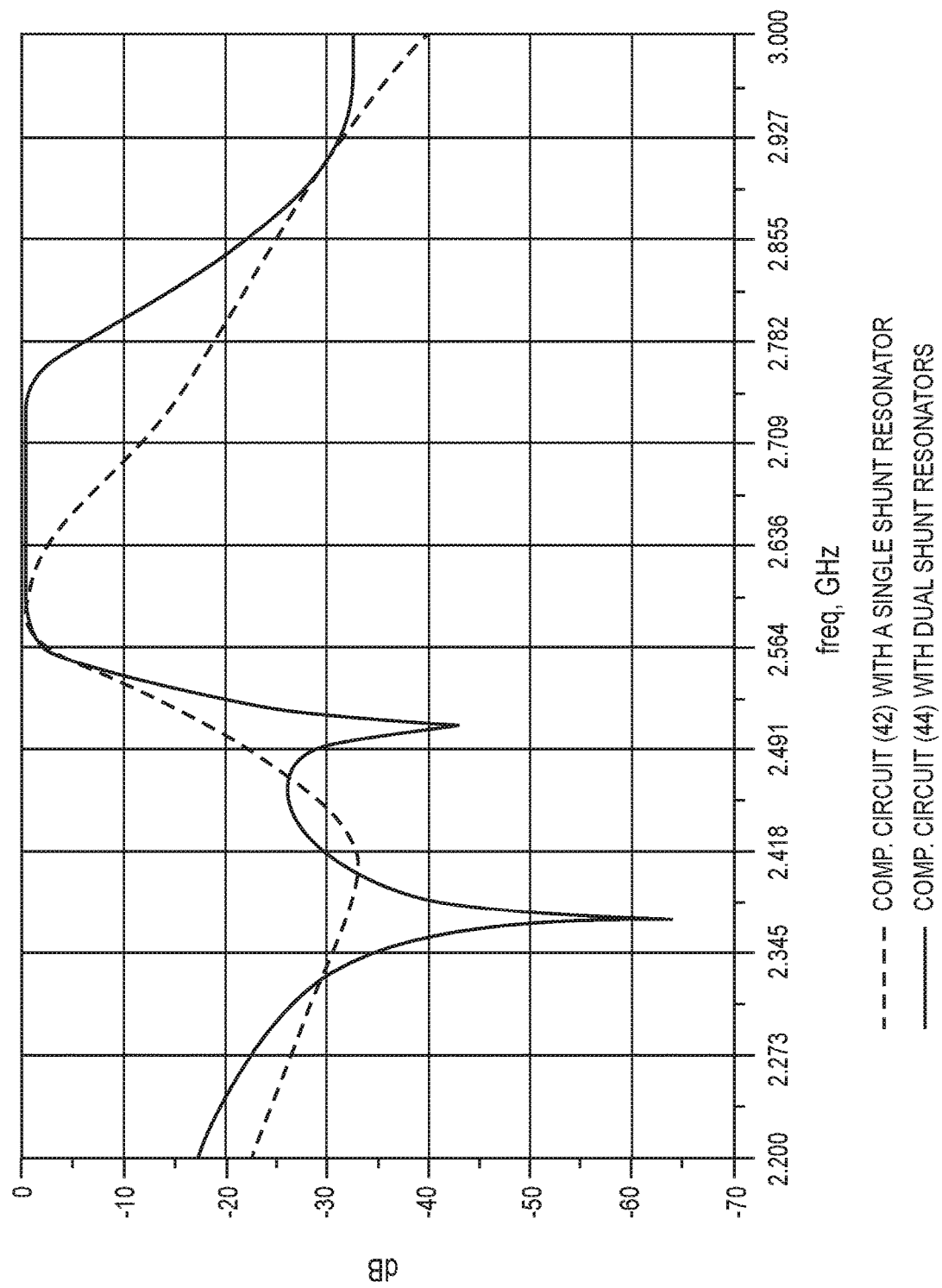
FIG. 15 is a graph that compares actual frequency responses of the overall circuits of FIGS. 11 and 13.

While FIGS. 12 and 14 are graphical representations, FIG. 15 is an actual comparison of the frequency response of the overall circuit using the different compensation circuits 74, 76, wherein the overall circuit using the compensation circuit 76 provides a significantly wider and better formed passband (solid line) than the overall circuit using the compensation circuit 74 (dashed line).

Figure 16:
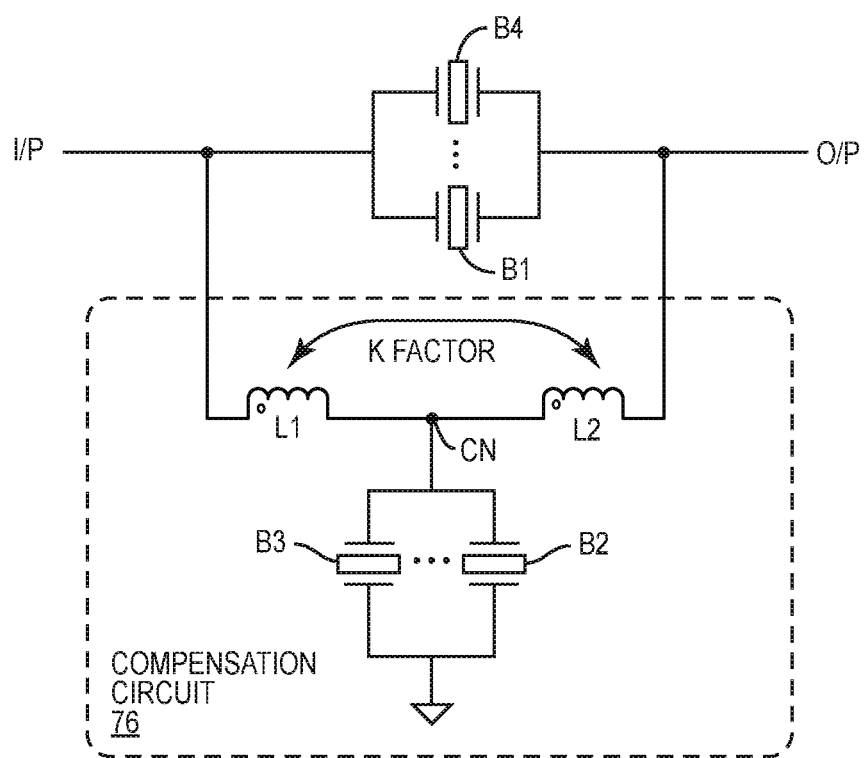
FIG. 16 illustrates a plurality of parallel acoustic resonators in parallel with a compensation circuit, which includes at least two shunt acoustic resonators, according to a second embodiment.

As illustrated in FIG. 16, the concepts described herein not only contemplate the use of multiple shunt resonators B2, B3, which are coupled between the common node CN and ground, but also multiple series resonators, such as series resonators B1 and B4, which are coupled in parallel with one another between the input node VP and the output node O/P. The series resonance frequencies $F_s$ of the series resonators B1, B4 are different from one another, and the series resonance frequencies $F_s$ of the shunt resonators B2, B3 are also different from one another and different from those of the series resonators. While only two series resonators B1, B4 and two shunt resonators B2, B3 are illustrated, any number of these resonators may be employed depending on the application and the desired characteristics of the overall frequency response of the circuit in which these resonators and associated compensation circuits 76 are employed. While the theory of operation is described further below, FIGS. 17 and 18 illustrate just two of the many possibilities.

Figure 17:
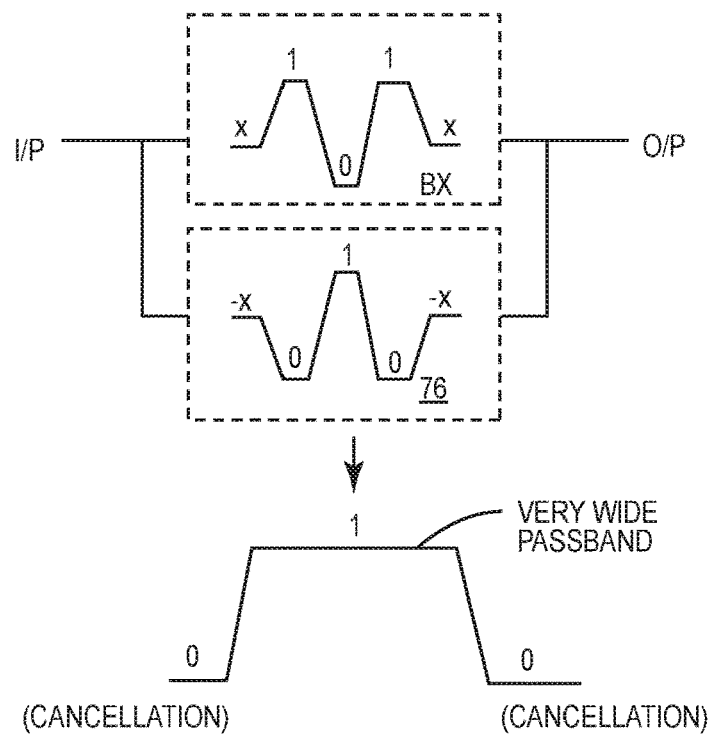
FIG. 17 is a graph that illustrates first exemplary frequency responses for the acoustic resonator, compensation circuit, and overall circuit of FIG. 16.

For FIG. 17, there are two series resonators B1, B4 and two shunt resonators B2, B3, with different and relatively dispersed series resonance frequencies $F_s$. FIG. 17 graphically illustrates the frequency responses of the combination of the two series resonators B1, B4 (inside the block referenced BX), the compensation circuit 76 with two shunt resonators B2, B3 (inside the block referenced 76), and the overall circuit in which the compensation circuit 76 is placed in parallel with the series resonator B1. As illustrated, the overall circuit in this configuration has the potential to provide a passband that is even wider than that for the embodiment of FIGS. 13 and 14. For example, passbands of greater than 100 MHz, 150 MHz, 175 MHz, and 200 MHz are contemplated at frequencies at or above 1.5 GHz, 1.75 GHz, and 2 GHz.

In other words, center-frequency-to-bandwidth ratios (fc/BW*100) of 3.5% to 9%, 12%, or greater are possible, wherein fc is the center frequency of the passband and BW is the bandwidth of the passband. If multiple passbands are provided, BW may encompass all of the provided passbands. Further, when multiple passbands are provided, the passbands may have the same or different bandwidths or center-frequency-to-bandwidth ratios. For example, one passband may have a relatively large center-frequency-to-bandwidth ratio, such as 12%, and a second passband may have a relatively small center-frequency-to-bandwidth ratio, such as 2%. Alternatively, multiple ones of the passbands may have a bandwidth of 100 MHz, or multiple ones of the passbands may have generally the same center-frequency-to-bandwidth ratios. In the latter case, the bandwidths of the passbands may inherently be different from one another, even though the center-frequency-to-bandwidth ratios are the same.

Figure 18:
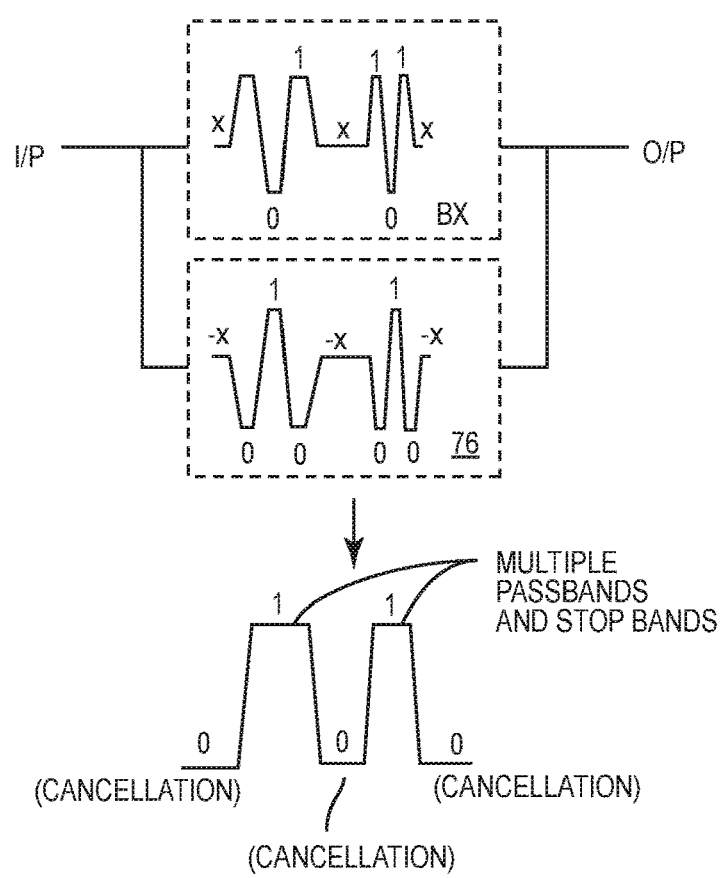
FIG. 18 is a graph that illustrates second exemplary frequency responses for the acoustic resonator, compensation circuit, and overall circuit of FIG. 16.

For FIG. 18, there are four series resonators, which are coupled in parallel with one another (not shown), and two shunt resonators (not shown) with different and more widely dispersed series resonance frequencies $F_s$. FIG. 18 graphically illustrates the frequency responses of the combination of the four series resonators (inside the block referenced BX), the compensation circuit 76 with two shunt resonators B2, B3 (inside the block referenced 76), and the overall circuit in which the compensation circuit 76 is placed in parallel with the series resonator B1. As illustrated, the overall circuit in this configuration provides multiple passbands, which are separated by a stopband. In this embodiment, two passbands are provided; however, the number of passbands may exceed two. The number of passbands in the bandwidth of each of the passbands is a function of the number of shunt and series resonators B1-B4 and the series resonance frequencies $F_s$ thereof.

Figure 19A:
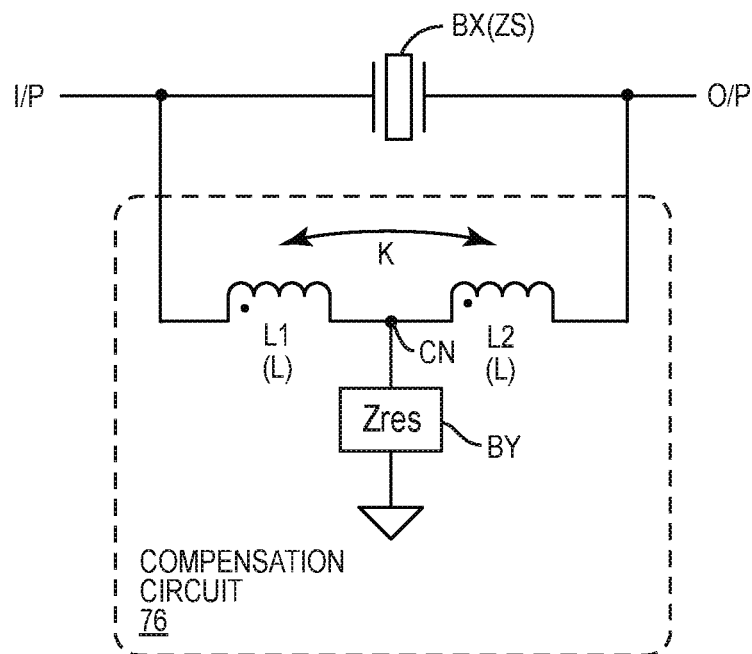
FIGS. 19A through 19D illustrate transformation of the T-circuit impedance architecture of the compensation circuit of FIG. 13 to a π (pi) impedance model.

The theory of the compensation circuit 76 follows and is described in association with FIGS. 19A through 19D and FIG. 20. With reference to FIG. 19A, assume the compensation circuit 76 includes the two negatively coupled inductors L1, L2, which have an inductance value L, and two or more shunt resonators BY, which have an overall shunt impedance Zres presented between the common node CN and ground. While the inductance values L of the negatively coupled inductors L1, L2 are described as being the same, these values may differ depending on the application. Also assume that the one or more series resonators BX present an overall series impedance ZS.

Figure 19B:
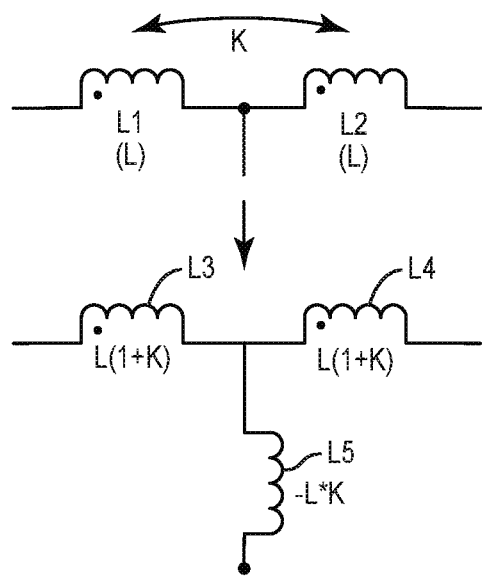
Figure 19C:
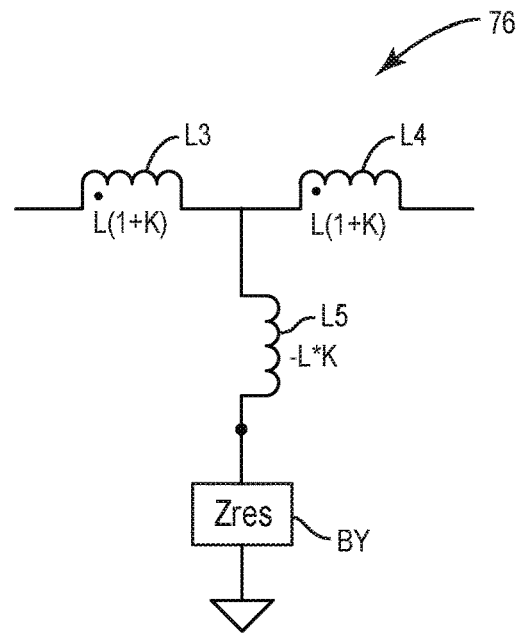

As shown in FIG. 19B, the two negatively coupled and series-connected inductors L1, L2 (without Zres) can be modeled as a T-network of three inductors L3, L4, and L5, wherein series inductors L3 and L4 are connected in series and have a value of L(1+K), and shunt inductor L5 has a value of −L*K, where K is a coupling factor between the negatively coupled inductors L1, L2. Notably, the coupling factor K is a positive number between 0 and 1. Based on this model, the overall impedance of the compensation circuit 76 is modeled as illustrated in FIG. 19C, wherein the shunt impedance Zres is coupled between the shunt inductor L5 and ground. The resulting T-network, as illustrated in FIG. 19C, can be transformed into an equivalent π (pi) network, as illustrated in FIG. 19D.

Figure 19D:
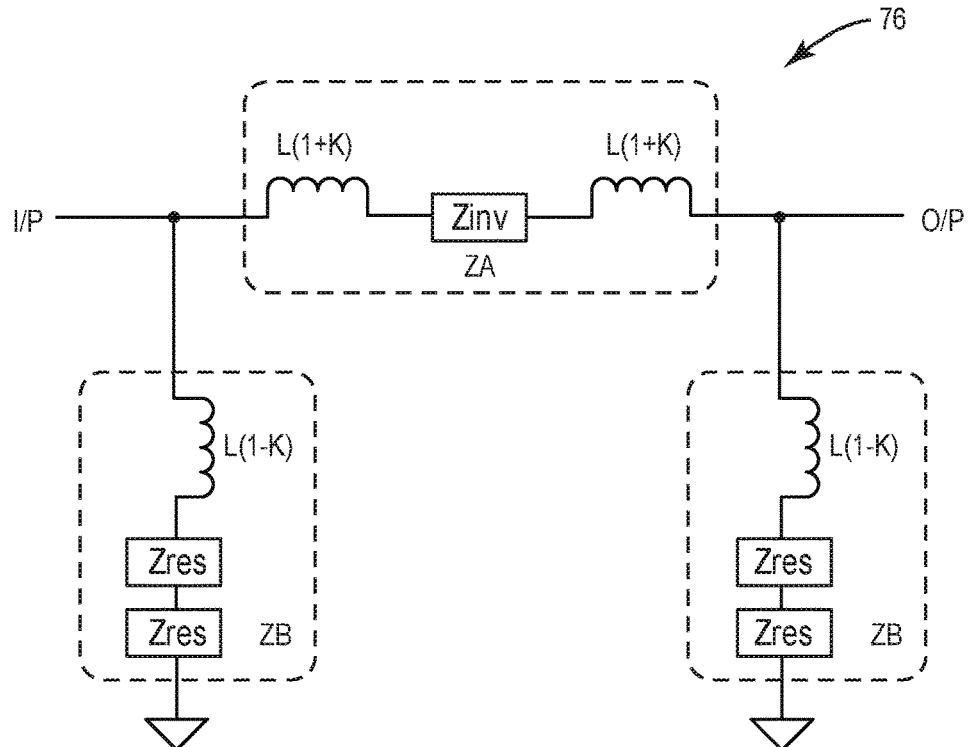

The π network of FIG. 19D can be broken into a series impedance ZA and two shunt equivalent impedances ZB. The series equivalent impedance ZA is represented by two series inductances of value L*(1+K), where K>0, and a special "inversion" impedance Zinv. The inversion impedance Zinv is equal to $[L(1+K)\omega]^2/[Zres-jLK\omega]$, where $\omega=2\pi f$ and f is the frequency. As such, the series equivalent impedance ZA equals $j*2*L(1+K)\omega+Zinv$ and is coupled between the input node I/O and the output node O/P. Each of the two shunt equivalent impedances ZB is represented by an inductor of value L(1−K) in series with two overall shunt impedances Zres.

Notably, the series equivalent impedance ZA has a negative capacitor behavior at certain frequencies at which broadband cancellation is desired and has series resonance at multiple frequencies. In general, the series equivalent impedance ZA has a multiple bandpass-bandstop characteristic, in that the series equivalent impedance ZA will pass some frequencies and stop others. When the series equivalent impedance ZA is placed in parallel with the series impedance ZS of the series resonators BX, which can also have a multiple bandpass-bandstop characteristic, a broadband filter or a filter with multiple passbands may be created.

Figure 20:
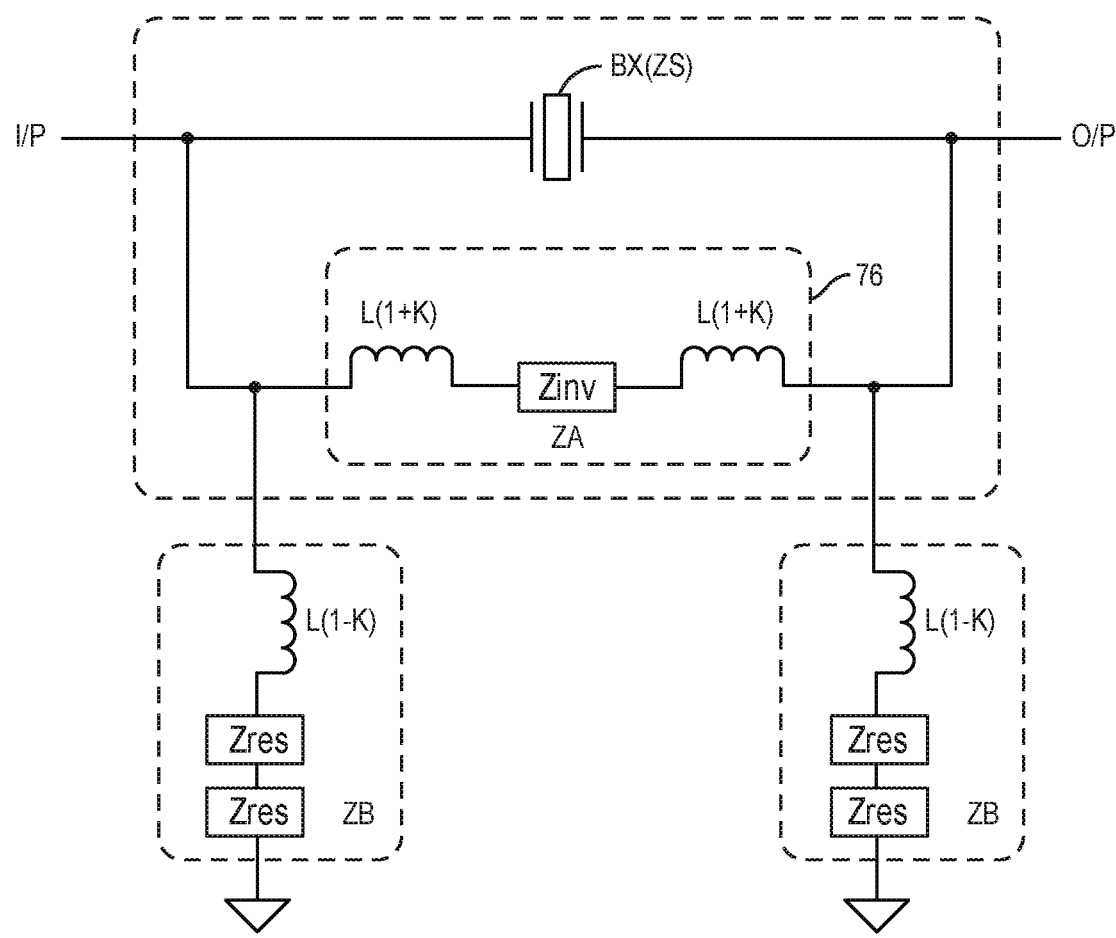
FIG. 20 illustrates the overall circuit of FIG. 13 using the π (pi) impedance model of FIG. 19D.

FIG. 20 illustrates the series impedance ZS of the series resonators BX in parallel with the series equivalent impedance ZA of the compensation circuit 76. The overall series impedance ZAs represents the series impedance ZS in parallel with the series equivalent impedance ZA. The two shunt impedances ZB are respectively coupled between the input port I/P and ground and the output port O/P and ground. The primary focus for the following discussion relates to the series equivalent impedance ZA and its impact on the series impedance ZS when the series equivalent impedance ZA is placed in parallel with the series impedance ZS.

Figure 21:
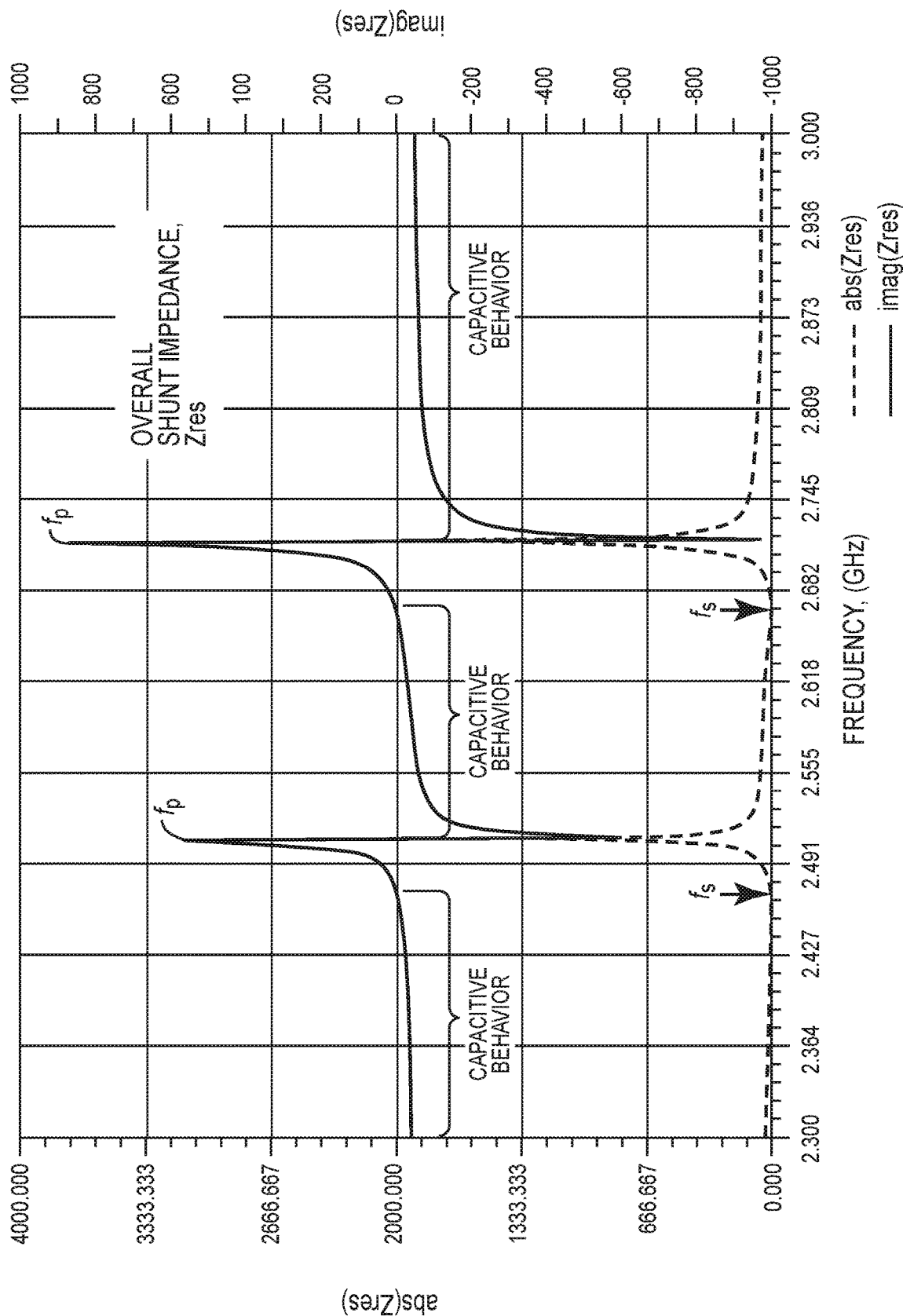
FIG. 21 is a graph illustrating the overall shunt impedance, Zres, according to one embodiment.

As noted previously, the series equivalent impedance ZA provides two primary functions. The first provides a negative capacitive behavior, and the second provides one or more additional series resonances between the input node I/P and the output node O/P. These additional series resonances are provided through the series equivalent impedance ZA and are in addition to any series resonances that are provided through the series impedance ZS of the series resonators BX. To help explain the benefits and concept of the negative capacitive behavior provided by the series equivalent impedance ZA, normal capacitive behavior is illustrated in association with the overall shunt impedance Zres, which is provided by the shunt resonators BY. FIG. 21 graphs the absolute (magnitude) and imaginary components of the overall shunt impedance Zres, which is formed by two shunt resonators BY coupled in parallel with one another.

The series resonance frequency $F_s$ for each of the two shunt resonators BY occurs when the absolute impedance (abs(Zres)) is at or near zero. Since there are two shunt resonators BY, the absolute impedance (abs(Zres)) is at or near zero at two frequencies, and as such, there are two series resonance frequencies $F_s$. The parallel resonance frequencies $F_p$ occur when the imaginary component (imag (Zres)) peaks. Again, since there are two shunt resonators BY, there are two series resonance frequencies $F_s$ provided by the overall shunt impedance Zres.

Whenever the imaginary component (imag(Zres)) of the overall shunt impedance Zres is less than zero, the overall shunt impedance Zres has a capacitive behavior. The capacitive behavior is characterized in that the reactance of the overall shunt impedance Zres is negative and decreases as frequency increases, which is consistent with capacitive reactance, which is represented by $1/j\omega C$. The graph of FIG. 21 identifies three regions within the impedance response of the overall shunt impedance Zres that exhibit capacitive behavior.

Figure 22:
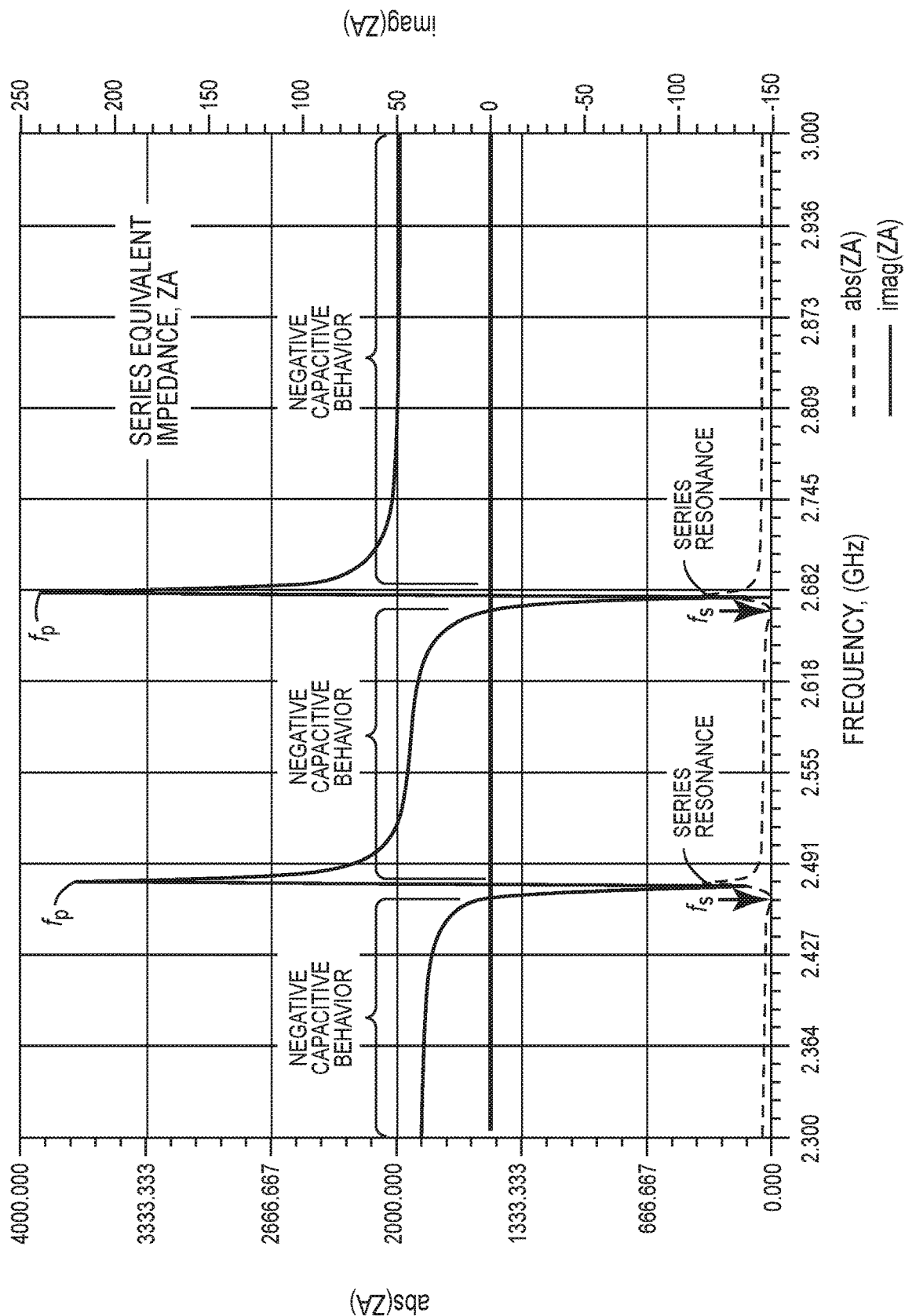
FIG. 22 is a graph illustrating the series equivalent impedance, ZA, according to one embodiment.

Turning now to FIG. 22, the series equivalent impedance ZA is illustrated over the same frequency range as that of the overall shunt impedance Zres, illustrated in FIG. 21. The series equivalent impedance ZA has two series resonance frequencies $F_s$, which occur when the absolute impedance (abs(ZA)) is at or near zero. The two series resonance frequencies $F_s$ for the series equivalent impedance ZA are different from each other and slightly different from those for the overall shunt impedance Zres. Further, the number of series resonance frequencies $F_s$ generally corresponds to the number of shunt resonators BY in the compensation circuit 76, assuming the series resonance frequencies $F_s$ are different from one another.

Interestingly, the imaginary component (imag(ZA)) of the series equivalent impedance ZA is somewhat inverted with respect to that of the overall shunt impedance Zres. Further, the imaginary component (imag(ZA)) of the series equivalent impedance ZA has a predominantly positive reactance. During the portions at which the imaginary component (imag(ZA)) is positive, the reactance of the series equivalent impedance ZA again decreases as frequency increases, which is indicative of capacitive behavior. However, the reactance is positive, whereas traditional capacitive behavior would present a negative reactance. This phenomenon is referred to as negative capacitive behavior. Those portions of the imaginary component (imag(ZA)) of the series equivalent impedance ZA that are positive and thus exhibit negative capacitive behavior are highlighted in the graph of FIG. 22.

The negative capacitive behavior of the series equivalent impedance ZA for the compensation circuit 76 is important, because when the series equivalent impedance ZA is placed in parallel with the series impedance ZS, the effective capacitance of the overall circuit is reduced. Reducing the effective capacitance of the overall circuit shifts the parallel resonance frequency $F_p$ of the series impedance ZS higher in the frequency range, which is described subsequently, and significantly increases the available bandwidth for passbands while providing excellent out-of-band rejection.

Figure 23A:
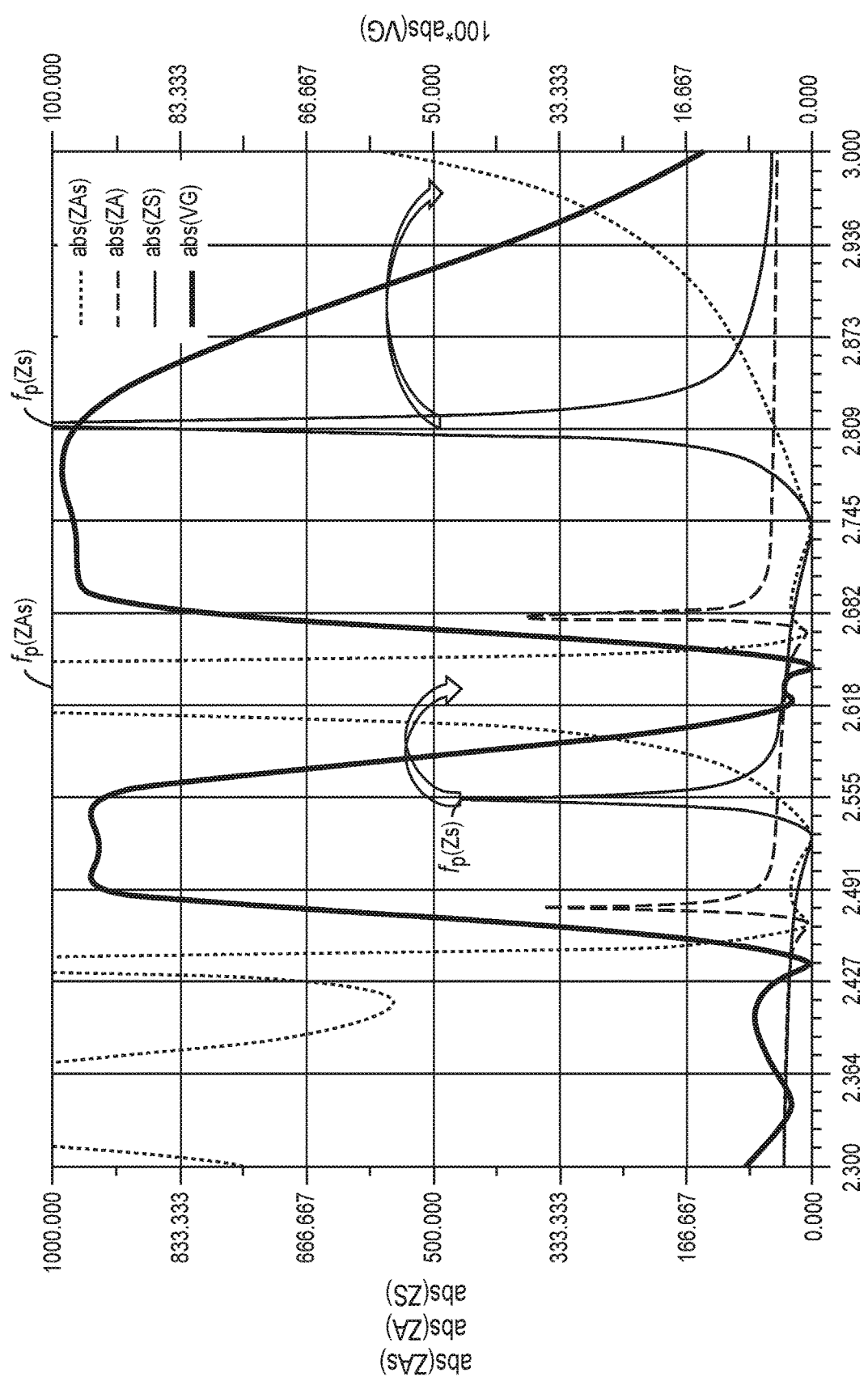
FIGS. 23A and 23B are graphs over different frequency ranges illustrating the absolute or magnitude of series impedance ZS, the series equivalent impedance ZA, and overall series impedance ZAs, according to one embodiment.
Figure 23B:
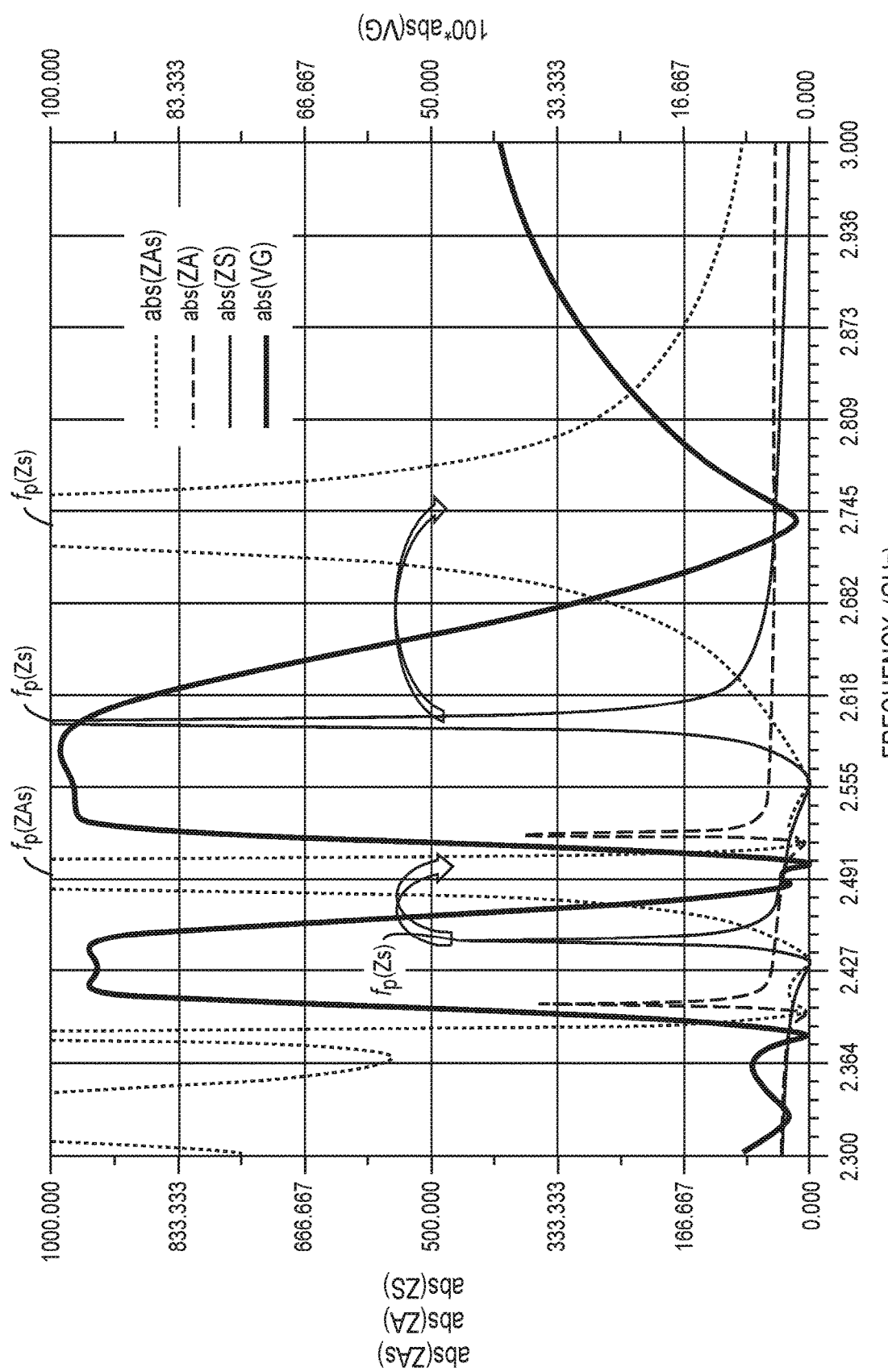

An example of the benefit is illustrated in FIGS. 23A and 23B. The thicker solid line, which is labeled abs(VG), represents the frequency response of the overall circuit illustrated in FIG. 16, wherein there are two series resonators BX and two shunt resonators BY in the compensation circuit 76. The frequency response has two well-defined passbands, which are separated by a stopband. The frequency response abs(VG) of the overall circuit generally corresponds to the inverse of the overall series impedance ZAs, which again represents the series impedance Zs in parallel with the series equivalent impedance ZA, as provided in FIG. 20.

Notably, the parallel resonance frequencies $F_p(ZS)$ of the series impedance ZS, in isolation, fall in the middle of the passbands of frequency response abs(VG) of the overall circuit. If the parallel resonance frequencies $F_p(ZS)$ of the series impedance ZS remained at these locations, the passbands would be severely affected. However, the negative capacitive behavior of the series equivalent impedance ZA functions to shift these parallel resonance frequencies $F_p(ZS)$ of the series impedance ZS to a higher frequency and, in this instance, above the respective passbands. This is manifested in the resulting overall series impedance ZAs, in which the only parallel resonance frequencies $F_p(ZAs)$ occur above and outside of the respective passbands. An additional benefit to having the parallel resonance frequencies $F_p(ZAs)$ occur outside of the respective passbands is the additional cancellation of frequencies outside of the passbands. Plus, the overall series impedance ZAs is lower than the series impedance ZS within the respective passbands.

A further contributor to the exemplary frequency response abs(VG) of the overall circuit is the presence of the additional series resonance frequencies $F_s$, which are provided through the series equivalent impedance ZA. These series resonance frequencies $F_s$ are offset from each other and from those provided through the series impedance ZS. The series resonance frequencies $F_s$ for the series equivalent impedance ZA in the series impedance ZS occur when the magnitudes of the respective impedances approach zero. The practical results are wider passbands, steeper skirts for the passbands, and greater rejection outside of the passbands, as evidenced by the frequency response abs(VG) of the overall circuit.

Figure 24:
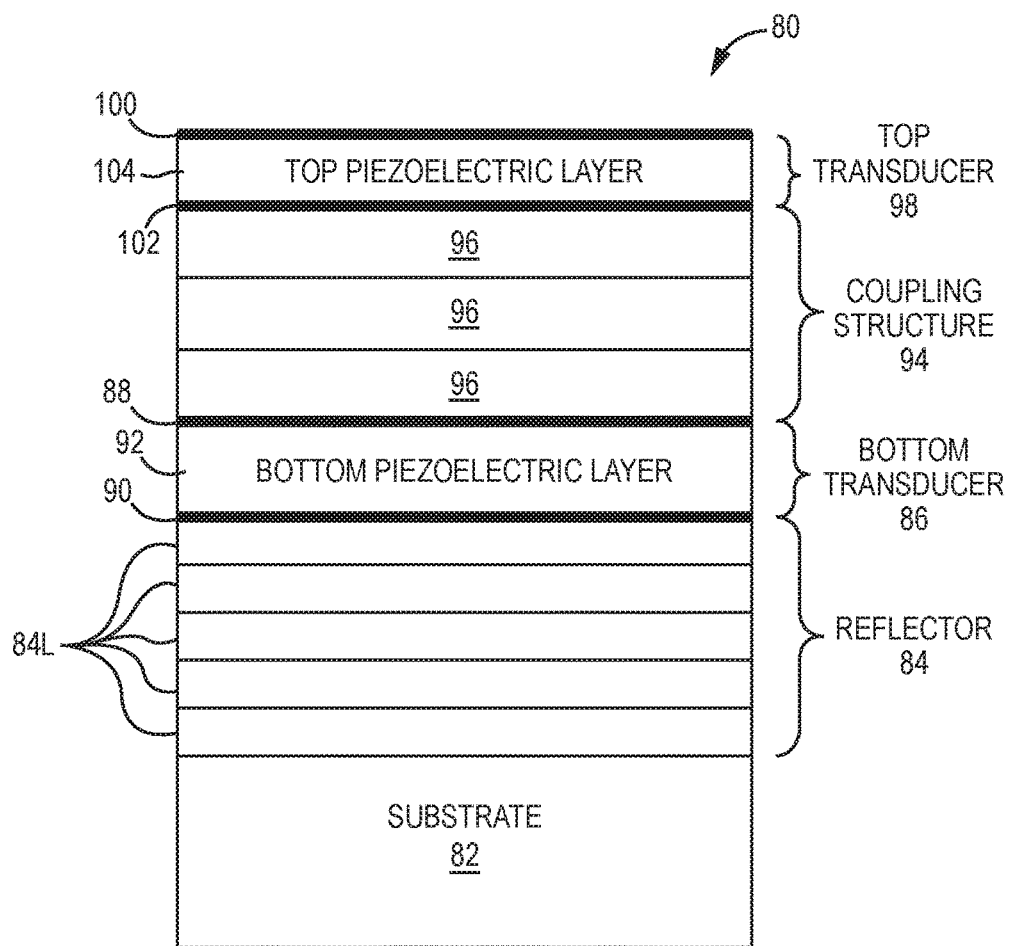
FIG. 24 is a cross-section of a coupled resonator filter (CRF), according to one embodiment.

Turning now to FIG. 24, a cross-section of a coupled resonator filter (CRF) 80 is illustrated. The CRF 80 is essentially a BAW device including two or more vertically stacked transducers. As with the BAW resonator 10 of FIG. 1, the CRF 80 has a substrate 82, a reflector 84, which includes multiple reflector layers 84L, and a bottom transducer 86. The bottom transducer 86 includes a top electrode 88, a bottom electrode 90, and a bottom piezoelectric layer 92 sandwiched therebetween. Unlike the BAW resonator 10, a coupling structure 94 is provided over the top electrode 88 of the bottom transducer 86. The coupling structure 94 includes multiple coupling layers 96, which are typically layers of alternating low and high acoustic impedances. A top transducer 98 is provided over the coupling structure 94 and includes a top electrode 100, a bottom electrode 102, and a top piezoelectric layer 104, which is sandwiched between the top electrode 100 and the bottom electrode 102.

Figure 25:
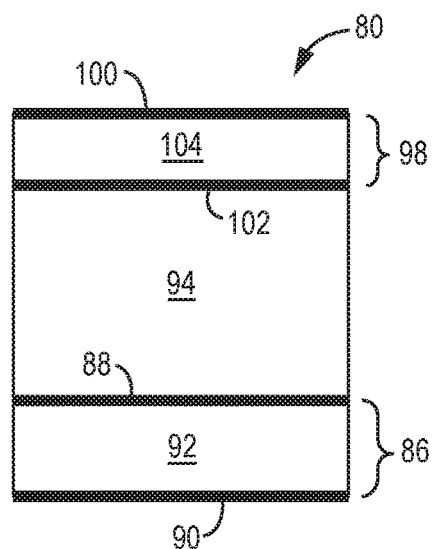
FIG. 25 is a simplified symbolic representation of the CRF of FIG. 24.

The coupling structure 94 functions to acoustically couple the top transducer 98 and the bottom transducer 86 for one or more acoustic wavelengths or ranges thereof. While the materials may vary, a coupling structure 94 that includes three coupling layers 96 could include alternating layers of oxide, tungsten, and oxide, respectively. The coupling layers 96 may have thicknesses corresponding to one quarter of the acoustic wavelength for the frequency or frequencies of coupling. A reduced complexity block representation of the CRF 80 is provided in FIG. 25, and is featured prominently in the embodiments discussed below. For further information regarding the functionality and structure of the CRF 80, reference is made to Lakin, K. M. (2002). Coupled Resonator Filters. Proceedings of the IEEE Ultrasonics Symposium. 1. 901-908 vol. 1. 10.1109/ULTSYM.2002.1193543; Shirakawa, Alexandre & Thalhammer, Robert & Jamneala, T & B. Koelle, Uli. (2011). Bulk Acoustic Wave-Coupled Resonator Filters: Concept, Design, and Application. International Journal of RF and Microwave Computer-Aided Engineering. 21. 477-485. 10.1002/mmce.20552; and U.S. Pat. No. 6,720,844, which are incorporated herein by reference in their entireties.

Figure 26:
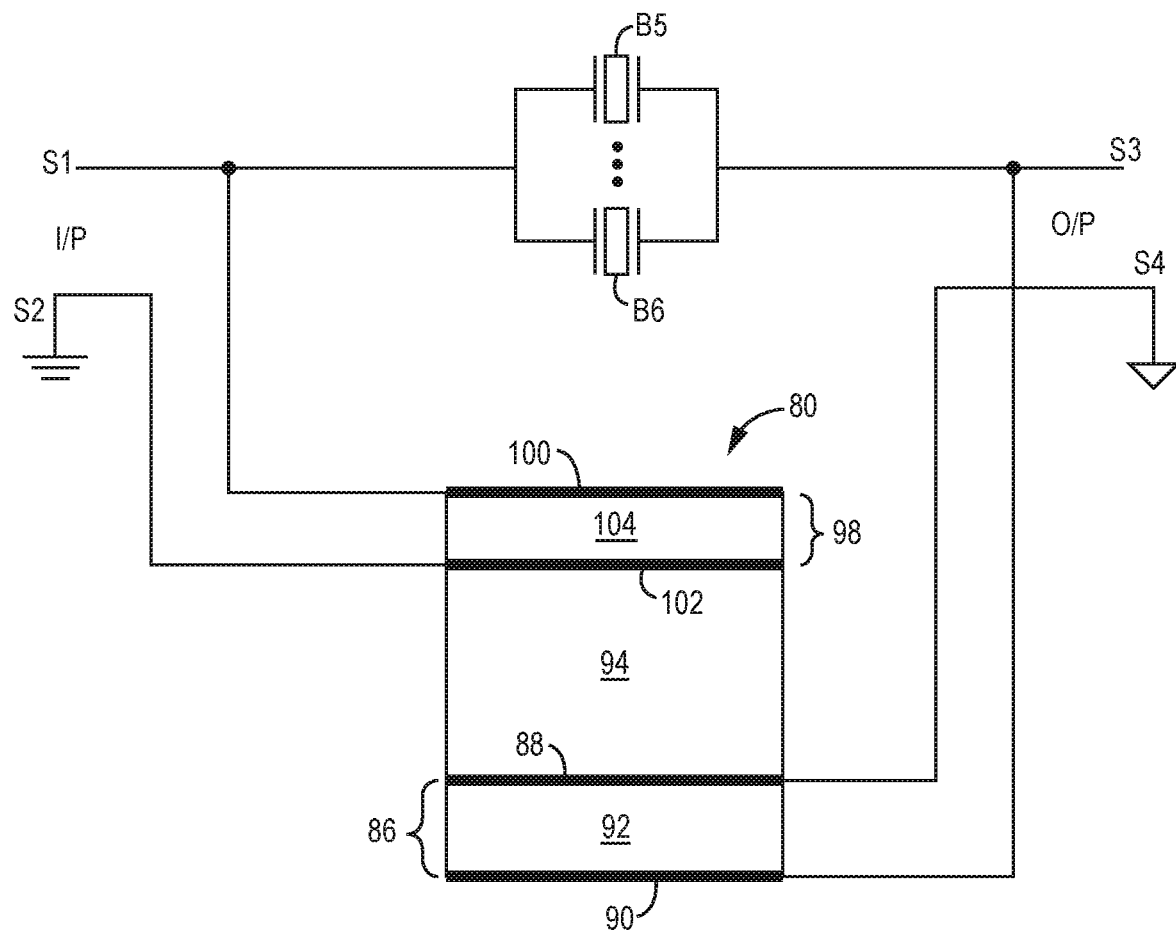
FIG. 26 is a first embodiment of an acoustically coupled filter.

For the embodiments described below, the compensation circuit 76 that includes the inductors L1 and L2 is replaced with one or more CRFs 80 to achieve the same or similar functionality. FIG. 26 illustrates a filter circuit where an input signal I/P is provided at terminals S1 and S2 and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground. The top electrode 100 of the top transducer 98 is coupled to terminal S1, and the bottom electrode 102 of the top transducer 98 is coupled to terminal S2. The top electrode 88 of the bottom transducer 86 is coupled to terminal S4, and the bottom electrode 90 of the bottom transducer 86 is coupled to terminal S3.

As such, the input signal drives the top transducer 98, which is acoustically coupled to the bottom transducer 86. The acoustic coupling will result in an electrical signal being generated between the top electrode 88 and the bottom electrode 90 of the bottom transducer 86. The portion or portions of the input signal that are coupled from the top transducer 98 to the bottom transducer 86 are effectively inverted (180 degrees phase-shifted) and presented to terminals S3, S4 for combining with those portions of the input signal that are passed through the BAW resonators B5, B6. As a result, the filter circuit illustrated in FIG. 26, which includes the CRF 80, is capable of functioning in a similar fashion to that illustrated in FIG. 16, which includes the compensation circuit 78. The inversion for the acoustically coupled embodiments is provided by effectively inverting the output taken off of one of the transducers 86, 98 relative to the input.

Figure 5A:
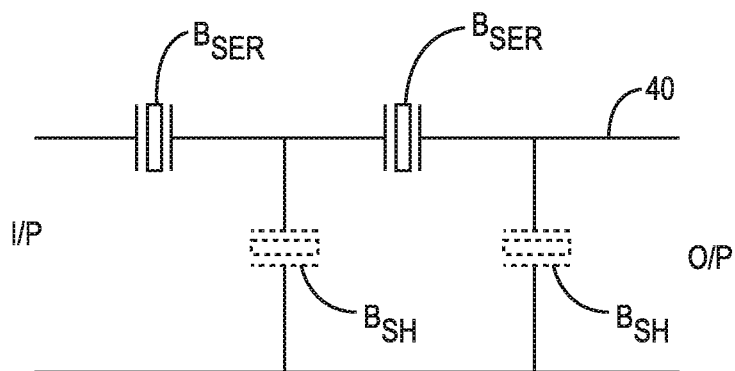
FIG. 5A is a schematic of a conventional ladder network.
Figure 5B:
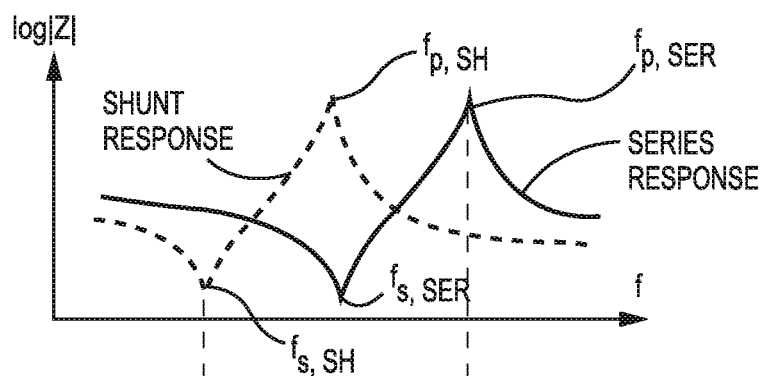
FIGS. 5B and 5C are graphs of a frequency response for BAW resonators in the conventional ladder network of FIG. 5A and a frequency response for the conventional ladder network of FIG. 5A.
Figure 5C:
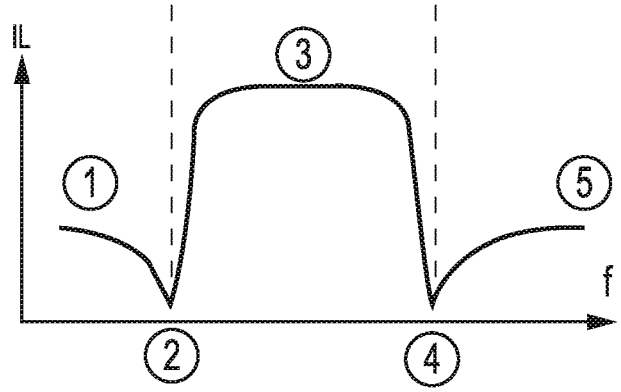
Figure 6A:
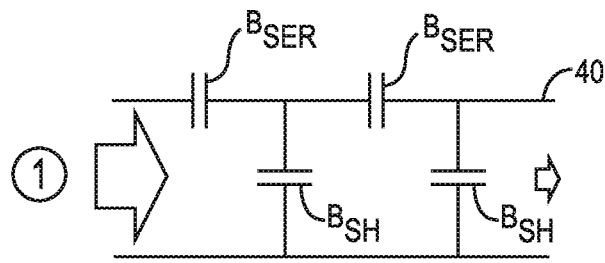
FIGS. 6A-6E are circuit equivalents for the ladder network of FIG. 5A at the frequency points 1, 2, 3, 4, and 5, which are identified in FIG. 5C.
Figure 6B:
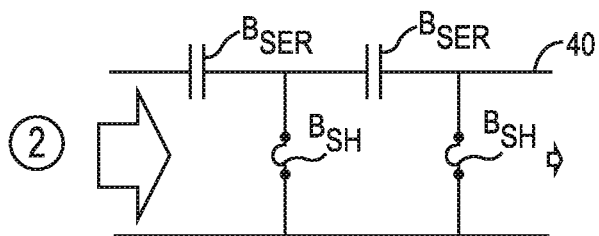
Figure 6C:
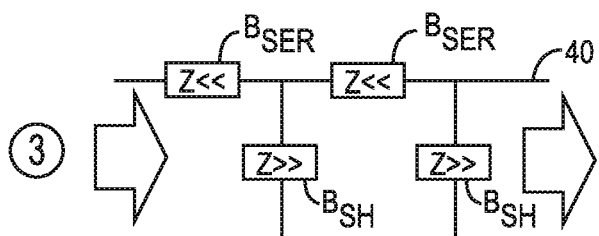
Figure 6D:
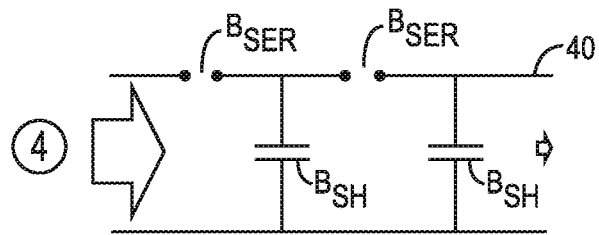
Figure 6E:
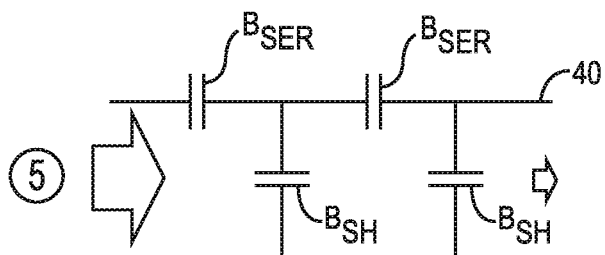

Notably, the circuit of FIG. 24 and those that follow have a similar topology and may provide similar functionality to a ladder network, such as that illustrated in FIG. 5A. The top transducer 98 corresponds to a shunt transducer or resonator that extends between the input terminals S1 and S2, the bottom transducer 86 corresponds to another shunt transducer or resonator that extends between the output terminals S3 and S4, and the BAW resonators B5, B6 are series acoustic resonators that extend between input terminal S1 and output terminal S3. The key difference is that the acoustic coupling between the top and bottom transduces 98, 86 provides designers additional parameters for fine tuning and improving the performance of such filter circuits in a cost and space effective manner. Connections of the various electrodes 88, 90, 100, 102 to the terminals S1, S2, S3, S4 may be such that the coupled frequencies are coupled in or out of phase depending on whether the supplemental acoustic energies are intended to combine with one another or cancel one another. The concepts herein provide tremendous flexibility for new design techniques.

Depending on the characteristics desired of the filter circuit, the series resonance frequencies of the top and bottom transducers 98, 86 may be the same or different. Further, the series resonance frequencies of the top and bottom transducers 98, 86 may, and will likely, be different from the series resonance frequencies of BAW resonators B5, B6. Further, the series resonance frequencies of the BAW resonators B5, B6 may, and likely will, be different from each other.

Figure 27:
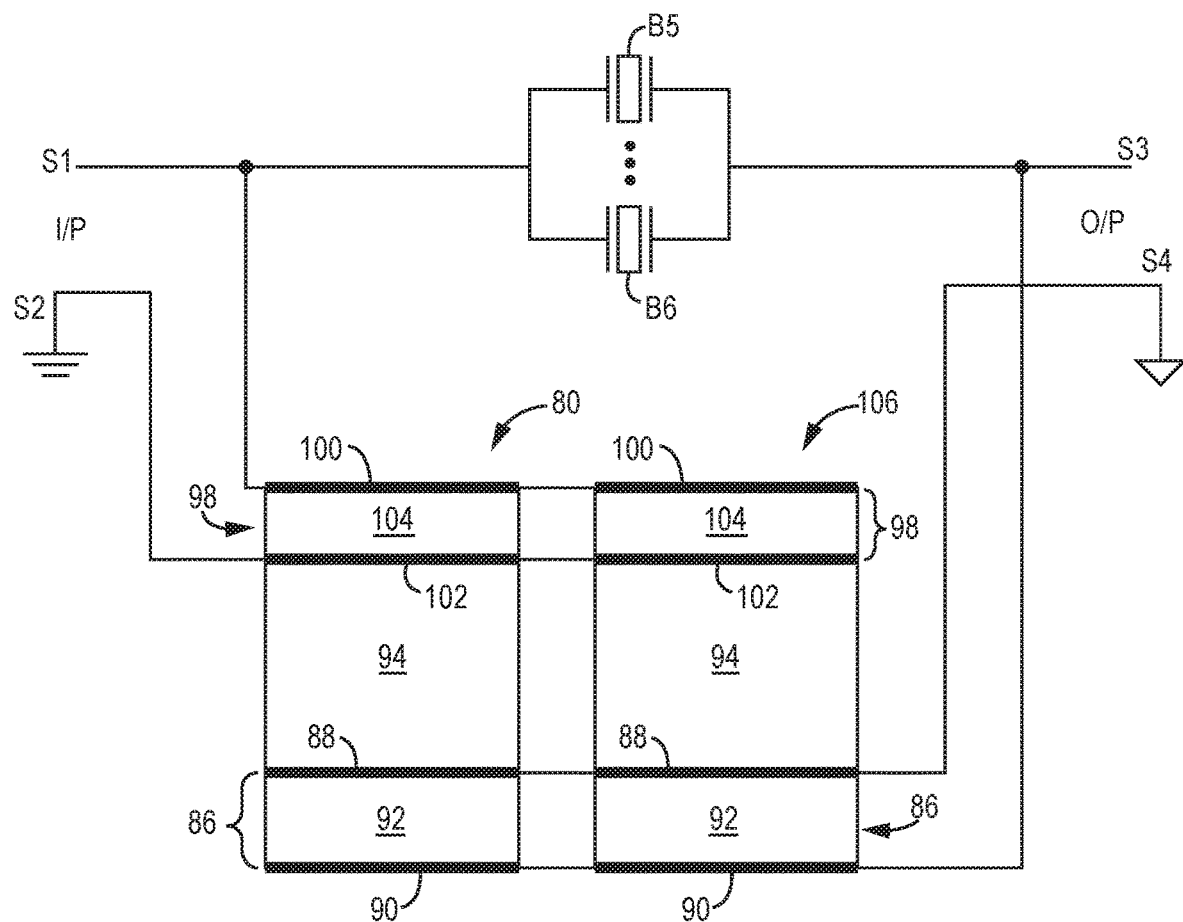
FIG. 27 is a second embodiment of an acoustically coupled filter.

Turning now to FIG. 27, the filter circuit includes a first CRF 80 and a second CRF 106. An input signal I/P is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrode 100 of the top transducer 98 of CRF 80 is coupled to terminal S1 as well as to the top electrode 100 of the top transducer 98 of CRF 106. The bottom electrode 102 of the top transducer 98 of CRF 80 is coupled to terminal S2 as well as to the bottom electrode 102 of the top transducer 98 of CRF 106. The top electrode 88 of the bottom transducer 86 of CRF 106 is coupled to terminal S4 as well as to the top electrode 88 of the bottom transducer 86 of CRF 80. The bottom electrode 90 of the bottom transducer 86 of CRF 106 is coupled to terminal S3 as well as to the bottom electrode 90 of the bottom transducer 86 of CRF 80.

For each CRF 80, 106, depending on the characteristics desired of the filter circuit, the series resonance frequencies of the top and bottom transducers 98, 86 may be the same or different. The series resonance frequencies for the top and bottom transducers 98, 86 may, and will likely, be different between the CRFs 80, 106. For example, the top and bottom transducers 98, 86 for CRF 80 may have a series resonance frequency of FS1, and the top and bottom transducers 98, 86 for CRF 106 may have a series resonance frequency of FS2, where FS1 is different than FS2. Alternatively, the top transducer 98 for CRF 80 may have a series resonance frequency of FS1, the bottom transducer 86 for CRF 80 may have a series resonance frequency of FS2, the top transducer 98 for CRF 106 may have a series resonance frequency of FS3, and the bottom transducer 86 for CRF 106 may have a series resonance frequency of FS4, wherein FS1, FS2, FS3, and FS4 are unique series resonance frequencies.

Figure 28:
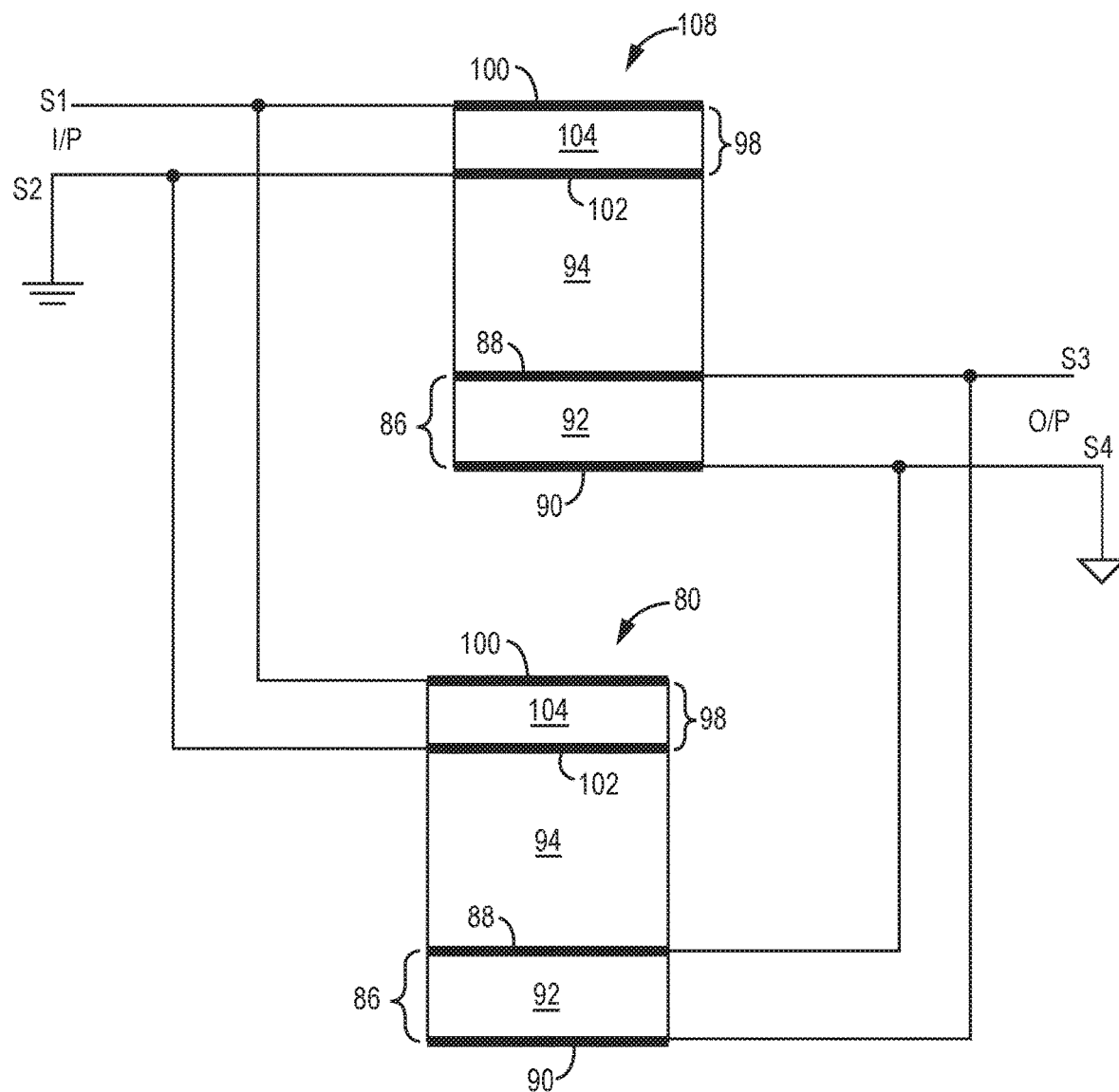
FIG. 28 is third embodiment of an acoustically coupled filter.

In FIG. 28, the parallel BAW resonators B5, B6 are replaced with a CRF 108. Again, an input signal I/P is provided at terminals S1 and S2, and an output signal O/P is provided at terminals S3 and S4. Terminal S2 is coupled to a first signal ground, and terminal S4 is coupled to a second signal ground. Terminal S1 is coupled to the top electrode 100 of the top transducer 98 of CRF 108 as well as to the top electrode 100 of the top transducer 98 of CRF 80. Terminal S2 is coupled to the bottom electrode 102 of the top transducer 98 of CRF 108 as well as to the bottom electrode 102 of the top transducer 98 of CRF 80.

Terminal S3 is coupled to the top electrode 88 of the bottom transducer 86 of CRF 108 as well as to the bottom electrode 90 of the bottom transducer 86 of CRF 80. Terminal S4 is coupled to the bottom electrode 90 of the bottom transducer 86 of CRF 108 as well as to the top electrode 88 of the bottom transducer 86 of CRF 80. As such, the signal generated across the bottom transducer 86 of CRF 80 is inverted relative to the signal generated across the bottom transducer 86 of CRF 108.

For each CRF 80, 108, depending on the characteristics desired of the filter circuit, the series resonance frequencies of the top and bottom transducers 98, 86 may be the same or different. The series resonance frequencies for the top and bottom transducers 98, 86 may, and will likely, be different between the CRFs 80, 108. For example, the top and bottom transducers 98, 86 for CRF 80 may have a series resonance frequency of FS1, and the top and bottom transducers 98, 86 for CRF 108 may have a series resonance frequency of FS2, where FS1 is different than FS2. Alternatively, the top transducer 98 for CRF 80 may have a series resonance frequency of FS1, the bottom transducer 86 for CRF 80 may have a series resonance frequency of FS2, the top transducer 98 for CRF 108 may have a series resonance frequency of FS3, and the bottom transducer 86 for CRF 108 may have a series resonance frequency of FS4, wherein FS1, FS2, FS3, and FS4 are unique series resonance frequencies.

Figure 29:
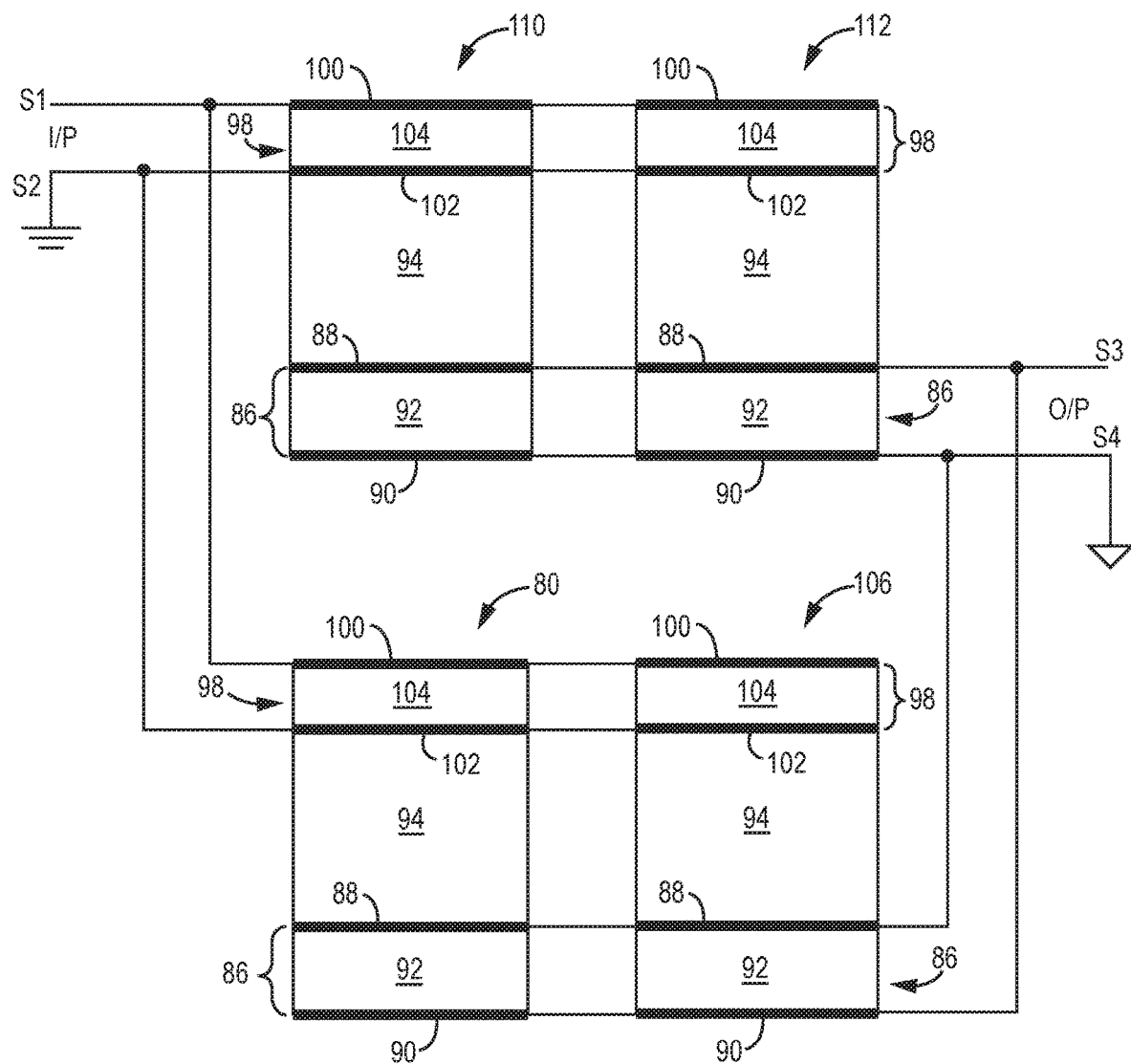
FIG. 29 is a fourth embodiment of an acoustically coupled filter.

Another embodiment is illustrated in FIG. 29. In this embodiment, four CRFs 80, 106, 110, 112 are provided. An input signal VP is provided at terminals S1 and S2, and an output signal O/P is provided at terminals S3 and S4. Terminal S2 is coupled to a first signal ground, and terminal S4 is coupled to a second signal ground. Terminal S1 is coupled to the top electrodes 100 of the top transducers 98 of CRFs 80, 106, 110, 112. Terminal S2 is coupled to the bottom electrodes 102 of the top transducers 98 of CRFs 80, 106, 110, 112.

Terminal S3 is coupled to the top electrodes 88 of the bottom transducers 86 of CRFs 110, 112 as well as to the bottom electrodes 90 of the bottom transducers 86 of CRFs 80, 106. Terminal S4 is coupled to the bottom electrodes 90 of the bottom transducers 86 of CRF 110, 112 as well as to the top electrodes 88 of the bottom transducers 86 of CRFs 80, 106. As such, the signals generated across the bottom transducers 86 of CRFs 80 and 106 are inverted relative to the signals generated across the bottom transducers 86 of CRFs 110, 112.

For each CRF 80, 106,110, 112 depending on the characteristics desired of the filter circuit, the series resonance frequencies of the top and bottom transducers 98, 86 may be the same or different. The series resonance frequencies for the top and bottom transducers 98, 86 may, and will likely, be different between the CRFs 80, 106, 110, 112. For example, the top and bottom transducers 98, 86 for CRF 80 may have a series resonance frequency of FS1, and the top and bottom transducers 98, 86 for CRF 106 may have a series resonance frequency of FS2, the top and bottom transducers 98, 86 for CRF 110 may have a series resonance frequency of FS3, and the top and bottom transducers 98, 86 for CRF 112 may have a series resonance frequency of FS4, wherein F1, F2, F3, and F4 are unique series resonance frequencies. Alternatively, the top transducer 98 for one or more of the CRFs 80, 106, 110, 112 may have a different series resonance frequency.

Figure 30:
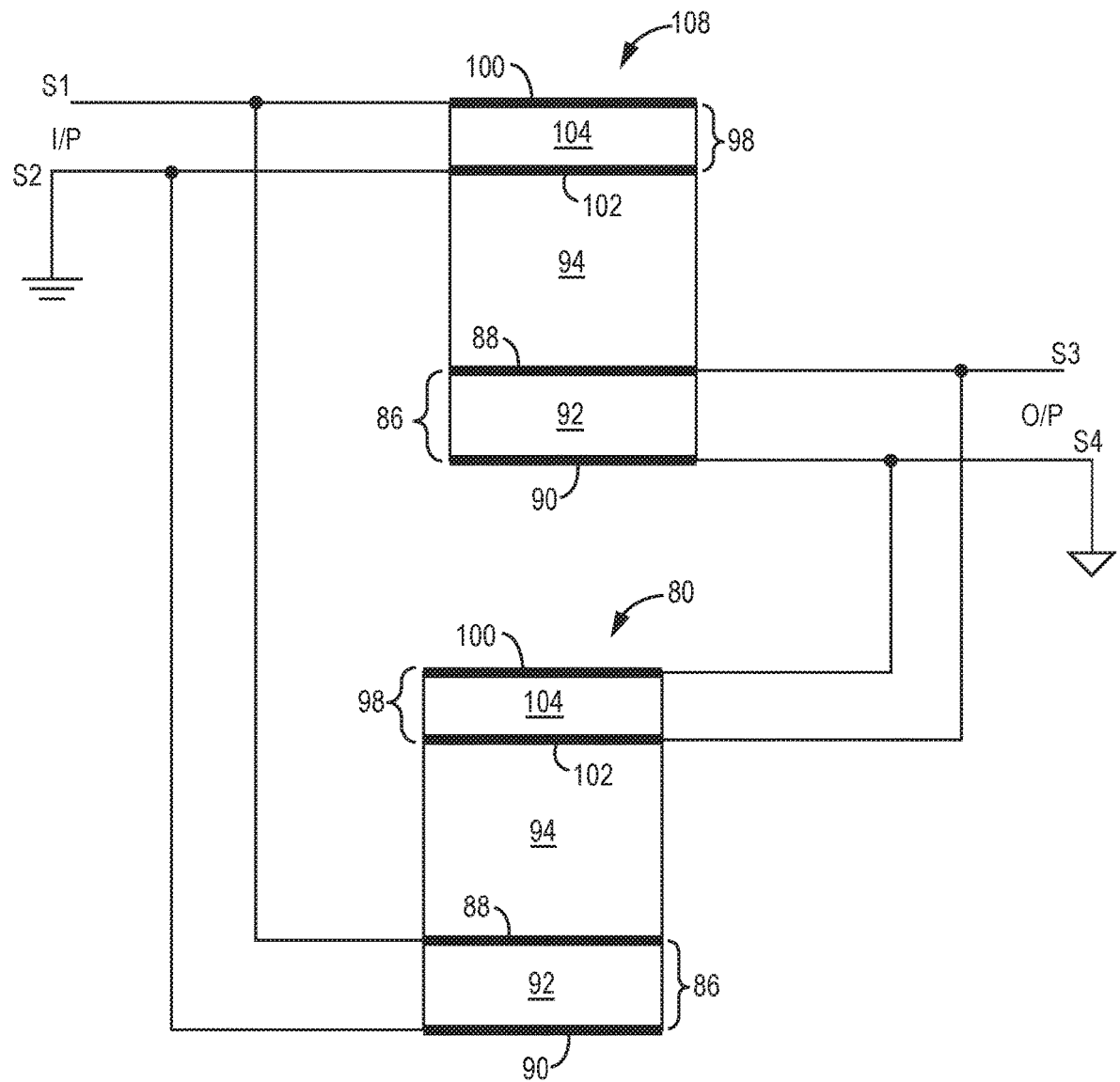
FIG. 30 is a fifth embodiment of an acoustically coupled filter.

A variant of the filter circuit of FIG. 28 is provided FIG. 30. In this embodiment, an input signal I/P is provided at terminals S1 and S2, and an output signal O/P is provided at terminals S3 and S4. Terminal S2 is coupled to a first signal ground, and terminal S4 is coupled to a second signal ground. Terminal S1 is coupled to the top electrode 100 of the top transducer 98 of CRF 108 as well as to the top electrode 88 of the bottom transducer 86 of CRF 80. Terminal S2 is coupled to the bottom electrode 102 of the top transducer 98 of CRF 108 as well as to the bottom electrode 90 of the bottom transducer 86 of CRF 80.

Terminal S3 is coupled to the top electrode 88 of the bottom transducer 86 of CRF 108 as well as to the bottom electrode 102 of the top transducer 98 of CRF 80. Terminal S4 is coupled to the bottom electrode 90 of the bottom transducer 86 of CRF 108 as well as to the bottom electrode 102 of the top transducer 98 of CRF 80. As such, the signal generated across the bottom transducer 86 of CRF 80 is inverted relative to the signal generated across the top transducer 98 of CRF 108.

For each CRF 80, 108, depending on the characteristics desired of the filter circuit, the series resonance frequencies of the top and bottom transducers 98, 86 may be the same or different. The series resonance frequencies for the top and bottom transducers 98, 86 may, and will likely, be different between the CRFs 80, 108. For example, the top and bottom transducers 98, 86 for CRF 80 may have a series resonance frequency of FS1, and the top and bottom transducers 98, 86 for CRF 108 may have a series resonance frequency of FS2, where FS1 is different than FS2. Alternatively, the top transducer 98 for CRF 80 may have a series resonance frequency of FS1, the bottom transducer 86 for CRF 80 may have a series resonance frequency of FS2, the top transducer 98 for CRF 108 may have a series resonance frequency of FS3, and the bottom transducer 86 for CRF 108 may have a series resonance frequency of FS4, wherein FS1, FS2, FS3, and FS4 are unique series resonance frequencies.

Figure 31:
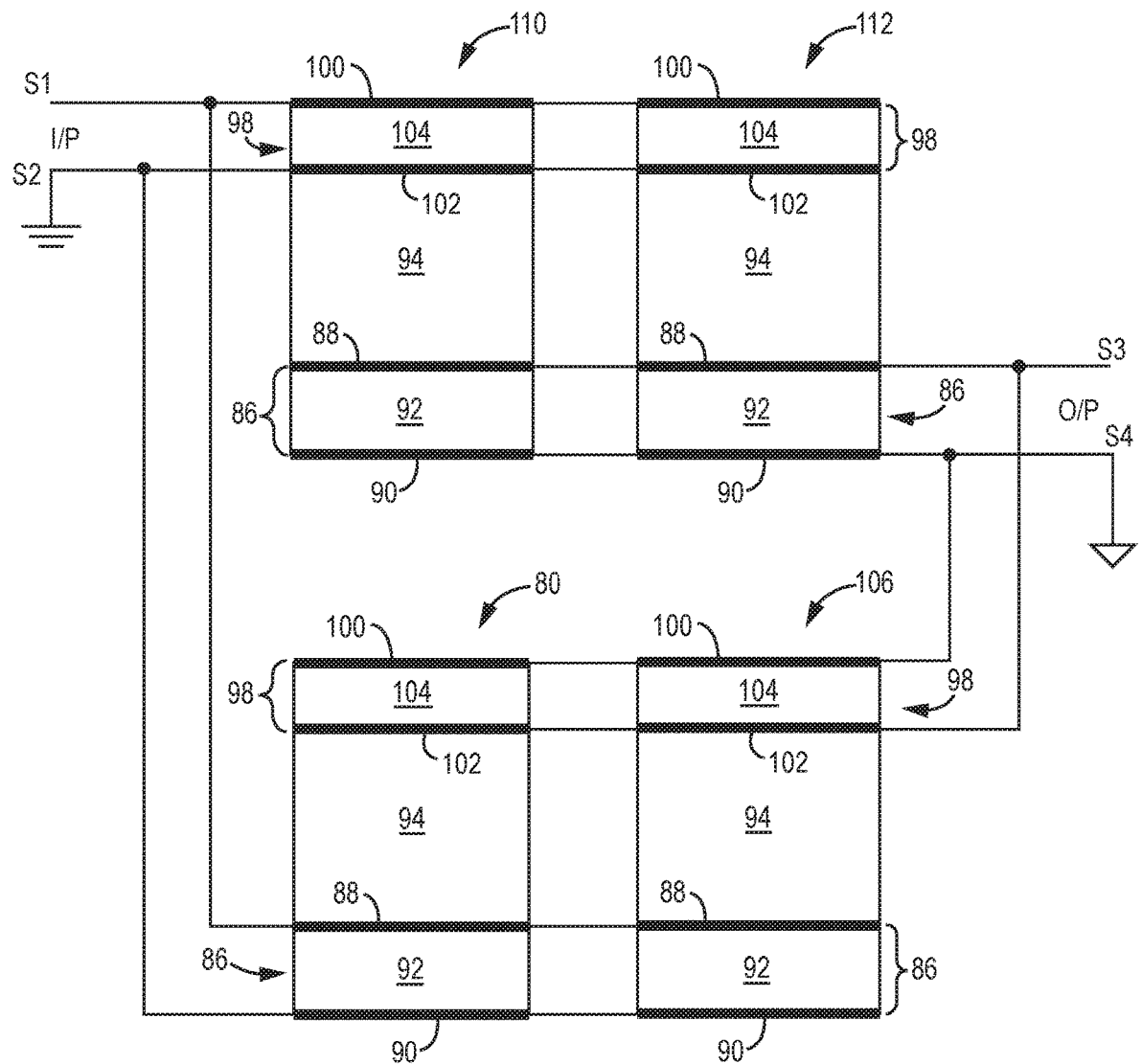
FIG. 31 is a sixth embodiment of an acoustically coupled filter.

A variant of the filter circuit of FIG. 29 is provided FIG. 31. In this embodiment, four CRFs 80, 106, 110, 112 are provided. An input signal VP is provided at terminals S1 and S2, and an output signal O/P is provided at terminals S3 and S4. Terminal S2 is coupled to a first signal ground, and terminal S4 is coupled to a second signal ground. Terminal S1 is coupled to the top electrodes 100 of the top transducers 98 of CRFs 110, 112 as well as to the top electrodes 88 of the bottom transducers 86 of CRFs 80, 106. Terminal S2 is coupled to the bottom electrodes 102 of the top transducers 98 of CRFs 110, 112 as well as to the bottom electrodes 90 of CRFs 80, 106.

Terminal S3 is coupled to the top electrodes 88 of the bottom transducers 86 of CRFs 110, 112 as well as to the bottom electrodes 102 of the top transducers 98 of CRFs 80, 106. Terminal S4 is coupled to the bottom electrodes 90 of the bottom transducers 86 of CRF 110, 112 as well as to the top electrodes 100 of the top transducers 98 of CRFs 80, 106. As such, the signals generated across the bottom transducers 86 of CRFs 80 and 106 are inverted relative to the signals generated across the top transducers 98 of CRFs 110, 112.

For each CRF 80, 106, 110, 112 depending on the characteristics desired of the filter circuit, the series resonance frequencies of the top and bottom transducers 98, 86 may be the same or different. The series resonance frequencies for the top and bottom transducers 98, 86 may, and will likely, be different between the CRFs 80, 106, 110, 112. For example, the top and bottom transducers 98, 86 for CRF 80 may have a series resonance frequency of FS1, and the top and bottom transducers 98, 86 for CRF 106 may have a series resonance frequency of FS2, the top and bottom transducers 98, 86 for CRF 110 may have a series resonance frequency of FS3, and the top and bottom transducers 98, 86 for CRF 112 may have a series resonance frequency of FS4, where F1, F2, F3, and F4 are unique series resonance frequencies.

In another example, the top transducers 98 for CRFs 80, 110 may have a series resonance frequency of FS1, the bottom transducers 86 for CRFs 80, 110 may have a series resonance frequency of FS2, the top transducers 98 for CRFs 106, 112 may have a series resonance frequency of FS3, and the bottom transducers 86 for CRFs 106, 112 may have a series resonance frequency of FS4, where F1, F2, F3, and F4 are unique series resonance frequencies. Other combinations are envisioned.

In the embodiments described above, vertical acoustic coupling occurs between the top transducer 98 and the bottom transducer 86 of the various CRFs 80, 106, 108, 110, 112. Any lateral, or transversal coupling between the transducers 86, 98 of adjacent CRFs 80, 106, 108, 110, 112 is minimal, if nonexistent. In the following embodiments, transversal, or lateral coupling occurs between certain transducers of different CRFs 80 or BAW resonators 10.

Figure 32:
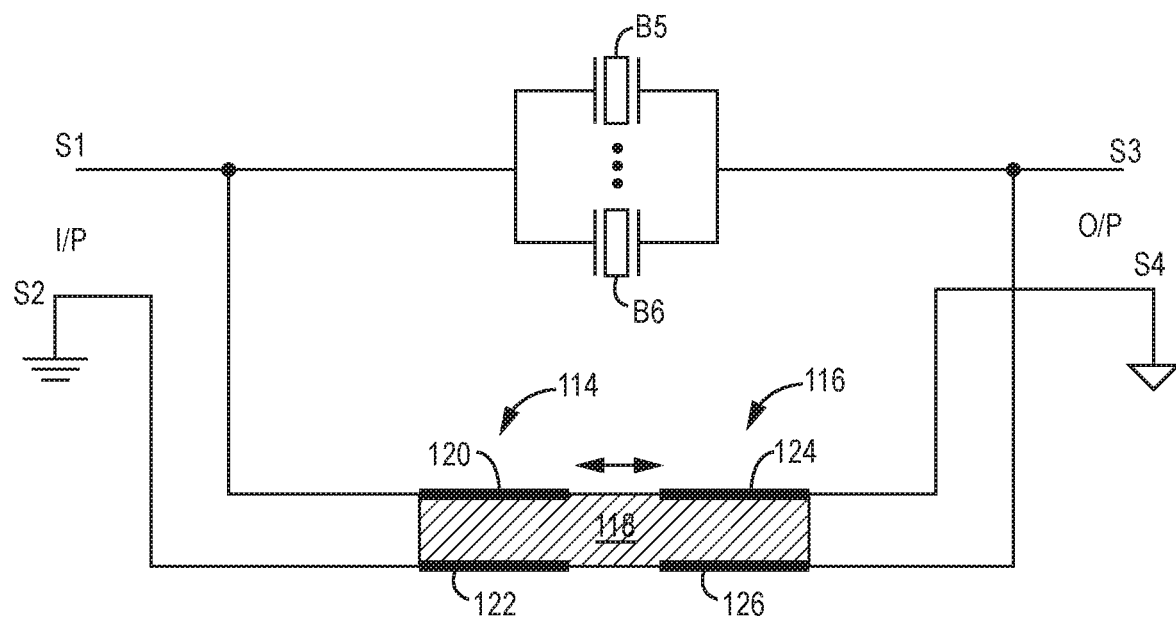
FIG. 32 is a seventh embodiment of an acoustically coupled filter.

With reference to FIG. 32, a basic embodiment that employs transversal acoustic coupling is illustrated. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

Two transducers 114, 116 are transversally acoustically coupled by sharing a piezoelectric layer 118 (shown) or other coupling material (not shown). Transducer 114 includes a portion (leftmost portion) of the piezoelectric layer 118 sandwiched between a top electrode 120 and a bottom electrode 122.

Transducer 116 includes a portion (rightmost portion) of the piezoelectric layer 118 sandwiched between a top electrode 124 and a bottom electrode 126.

Terminal S1 is coupled to the top electrode 120 of transducer 114. Terminal S2 is coupled to the bottom electrode 122 of transducer 114. Terminal S3 is coupled to the bottom electrode 126 of transducer 116. Terminal S4 is coupled to the top electrode 124 of transducer 116. As such, the output of transducer 116 is inverted relative to the input of transducer 114. The series resonance frequencies of the respective transducers 114, 116 may be the same or different depending on the application.

Figure 33:
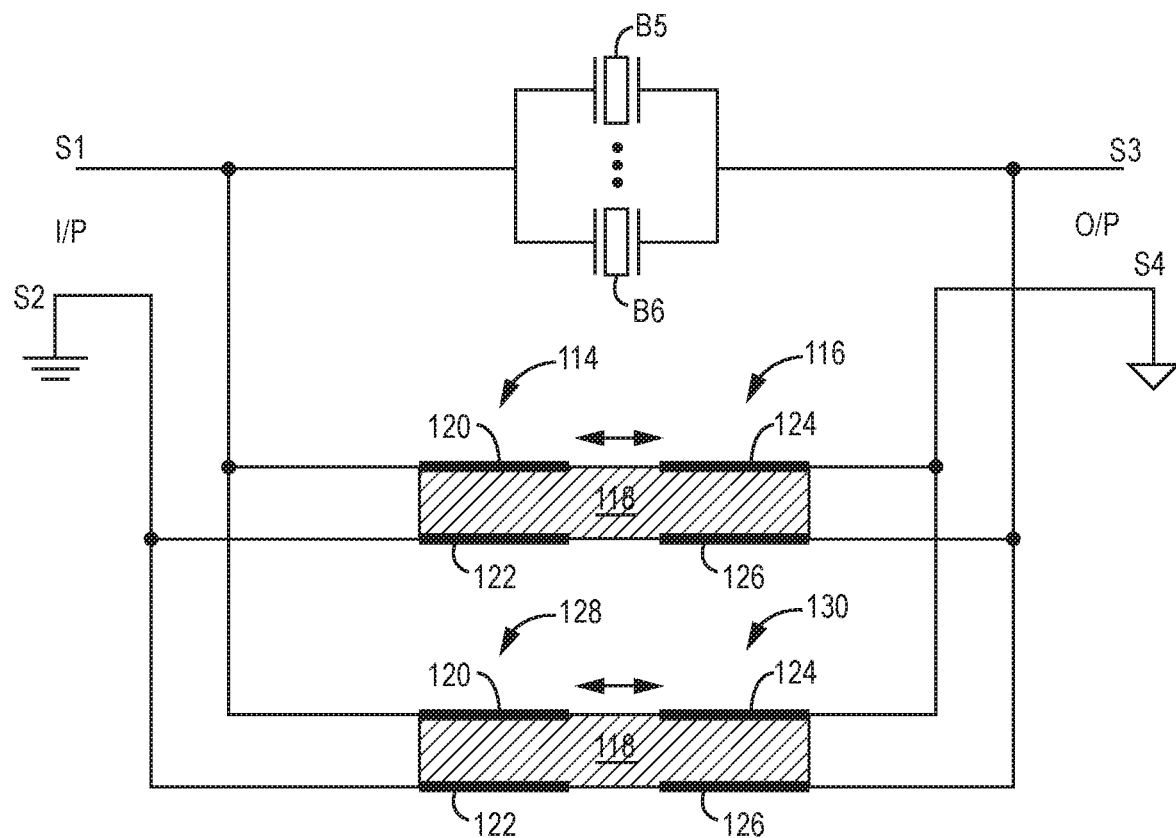
FIG. 33 is an eighth embodiment of an acoustically coupled filter.

The embodiment of FIG. 33 builds on that of FIG. 32. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

A first pair of transducers 114, 116 are transversally acoustically coupled by sharing a piezoelectric layer 118 and are coupled between the input terminals S1, S2 and the output terminals S3, S4. A second pair of transducers 128, 130 are transversally acoustically coupled by sharing a piezoelectric layer 118 and are coupled between the input terminals S1, S2 and the output terminals S3, S4. The first pair of transducers 114, 116 is effectively coupled in parallel with the second pair of transducers 128, 130.

Transducer 114 includes a portion (leftmost portion) of the piezoelectric layer 118 sandwiched between a top electrode 120 and a bottom electrode 122. Transducer 116 includes a portion (rightmost portion) of the piezoelectric layer 118 sandwiched between a top electrode 124 and a bottom electrode 126. Similarly, transducer 128 includes a portion (leftmost portion) of the piezoelectric layer 118 sandwiched between a top electrode 120 and a bottom electrode 122. Transducer 130 includes a portion (rightmost portion) of the piezoelectric layer 118 sandwiched between a top electrode 124 and a bottom electrode 126.

Terminal S1 is coupled to the top electrodes 120 of transducers 114, 128. Terminal S2 is coupled to the bottom electrodes 122 of transducers 114, 128. Terminal S3 is coupled to the top electrodes 124 of transducers 116, 130. Terminal S4 is coupled to the bottom electrodes 126 of transducers 116, 130. As such, the output of transducer 116 is inverted relative to the input of transducer 114, and the output of transducer 130 is inverted relative to the input of transducer 128. The series resonance frequencies of the respective transducers 114, 116 as well as respective transducers 128, 130 may be the same or different depending on the application. As such, transducers 114 and 116 may have the same or different resonance frequencies. The same applies to transducers 128 and 130.

Figure 34:
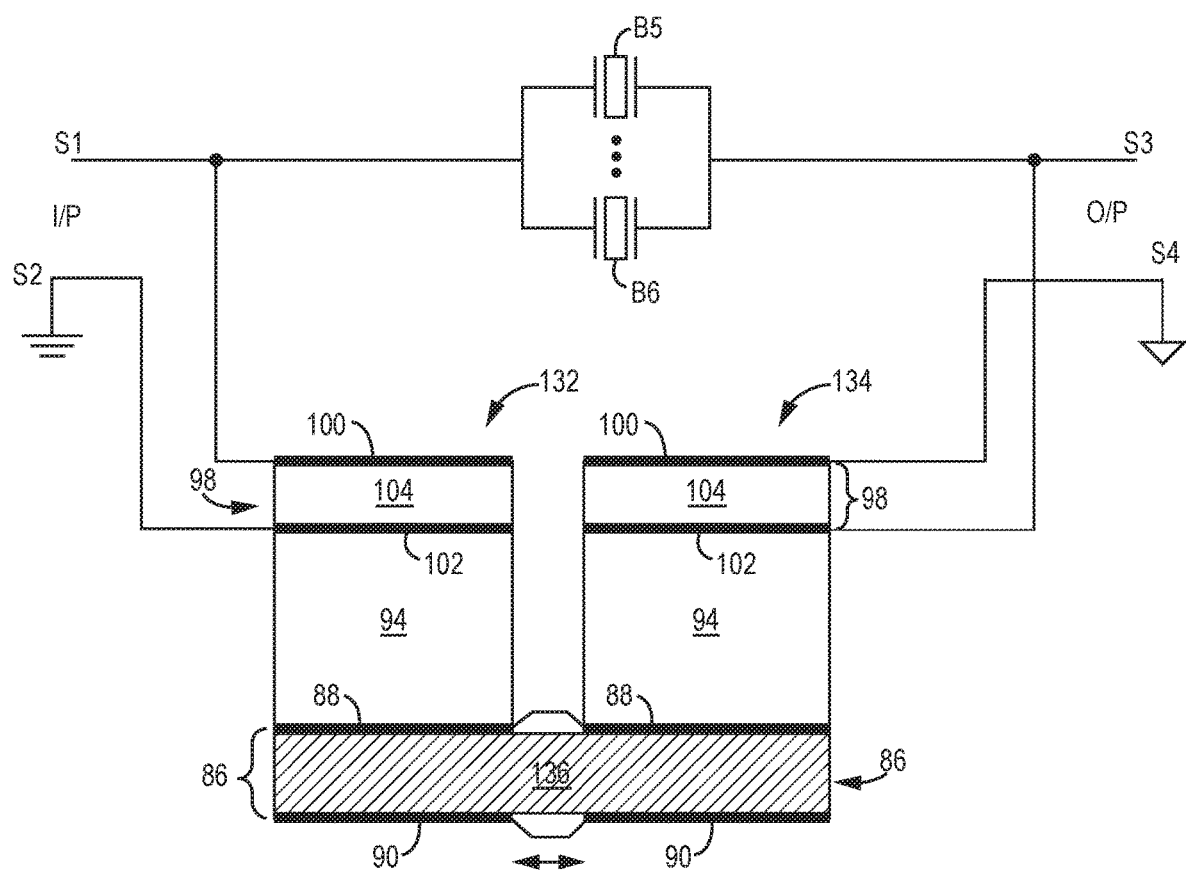
FIG. 34 is a ninth embodiment of an acoustically coupled filter.

FIG. 34 illustrates an embodiment where the bottom transducers 86 of different CRFs 132, 134 are transversally acoustically coupled. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrode 100 of the top transducer 98 of CRF 132 is coupled to terminal S1. The bottom electrode 102 of the top transducer 98 of CRF 132 is coupled to terminal S2. The top electrode 100 of the top transducer 98 of CRF 134 is coupled to terminal S4. The bottom electrode 102 of the top transducer 98 of CRF 134 is coupled to terminal S3. The top electrodes 88 of the bottom transducers 86 are coupled to one another, and the bottom electrodes 90 of the bottom transducers 86 are coupled to one another.

In this embodiment, the bottom transducers 86 of CRFs 132, 134 are transversally acoustically coupled via a common piezoelectric layer 136. The top transducers 98 are not transversally acoustically coupled. In particular, the bottom transducer 86 of CRF 132 includes a portion (leftmost portion) of a piezoelectric layer 136 sandwiched between a top electrode 88 and a bottom electrode 90. The bottom transducer 86 of CRF 134 includes a portion (rightmost portion) of the same piezoelectric layer 136 sandwiched between a top electrode 88 and a bottom electrode 90.

For each CRF 132, 134, depending on the characteristics desired of the filter circuit, the series resonance frequencies of the top and bottom transducers 98, 86 may be the same or different. The series resonance frequencies for the top and bottom transducers 98, 86 may be different between the CRFs 132, 134. For example, the top and bottom transducers 98, 86 for CRF 132 may have a series resonance frequency of FS1, and the top and bottom transducers 98, 86 for CRF 134 may have a series resonance frequency of FS2, where FS1 is different than FS2. In another embodiment, the top and bottom transducers 98, 86 for both CRFs 132, 134 may have a series resonance frequency of FS1. Alternatively, the top transducer 98 for CRF 132 may have a series resonance frequency of FS1, the bottom transducer 86 for CRF 132 may have a series resonance frequency of FS2, the top transducer 98 for CRF 134 may have a series resonance frequency of FS3, and the bottom transducer 86 for CRF 134 may have a series resonance frequency of FS4, wherein FS1, FS2, FS3, and FS4 are unique series resonance frequencies.

Figure 35:
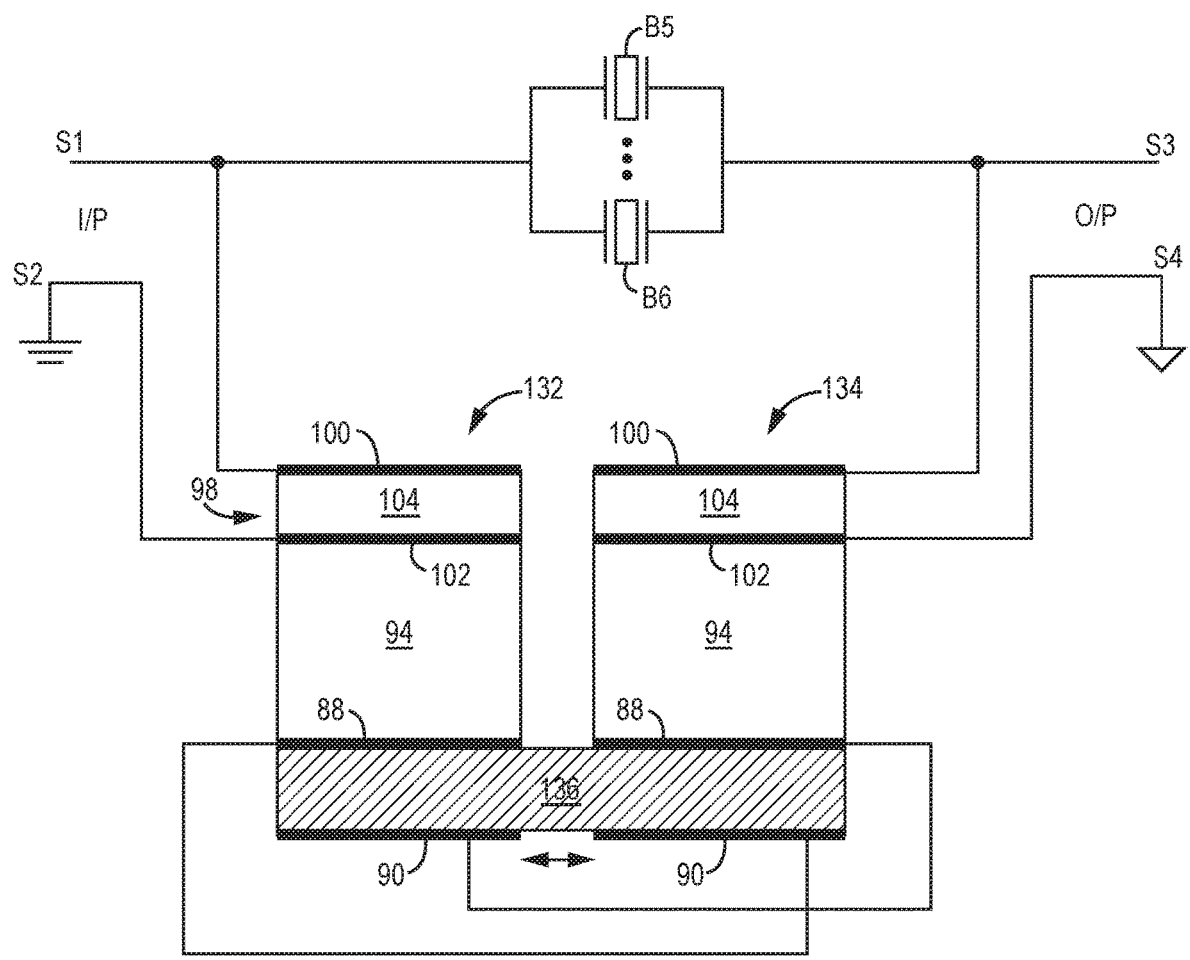
FIG. 35 is a tenth embodiment of an acoustically coupled filter.

FIG. 35 illustrates an embodiment where transducers 86 of different CRFs 132, 134 are transversally acoustically coupled. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrode 100 of the top transducer 98 of CRF 132 is coupled to terminal S1. The bottom electrode 102 of the top transducer 98 of CRF 132 is coupled to terminal S2. The top electrode 100 of the top transducer 98 of CRF 134 is coupled to terminal S3. The bottom electrode 102 of the top transducer 98 of CRF 134 is coupled to terminal S4. The top electrode 88 of the bottom transducer 86 of CRF 132 is coupled to the bottom electrode 90 of the bottom transducer 86 of CRF 134. The bottom electrode 90 of bottom transducer 86 of CRF 132 is coupled to the top electrode 88 of the bottom transducer 86 of CRF 134.

In this embodiment, the bottom transducers 86 of CRFs 132, 134 are transversally acoustically coupled via a common piezoelectric layer 136. The top transducers 98 are not transversally acoustically coupled. In particular, the bottom transducer 86 of CRF 132 includes a portion (leftmost portion) of a piezoelectric layer 136 sandwiched between a top electrode 88 and a bottom electrode 90. The bottom transducer 86 of CRF 134 includes a portion (rightmost portion) of the same piezoelectric layer 136 sandwiched between a top electrode 88 and a bottom electrode 90.

For each CRF 132, 134, depending on the characteristics desired of the filter circuit, the series resonance frequencies of the top and bottom transducers 98, 86 may be the same or different. The series resonance frequencies for the top and bottom transducers 98, 86 may be different between the CRFs 132, 134. For example, the top and bottom transducers 98, 86 for CRF 132 may have a series resonance frequency of FS1, and the top and bottom transducers 98, 86 for CRF 134 may have a series resonance frequency of FS2, where FS1 is different than FS2. In another embodiment, the top and bottom transducers 98, 86 for both CRFs 132, 134 may have a series resonance frequency of FS1. Alternatively, the top transducer 98 for CRF 132 may have a series resonance frequency of FS1, the bottom transducer 86 for CRF 132 may have a series resonance frequency of FS2, the top transducer 98 for CRF 134 may have a series resonance frequency of FS3, and the bottom transducer 86 for CRF 134 may have a series resonance frequency of FS4, wherein FS1, FS2, FS3, and FS4 are unique series resonance frequencies.

Figure 36:
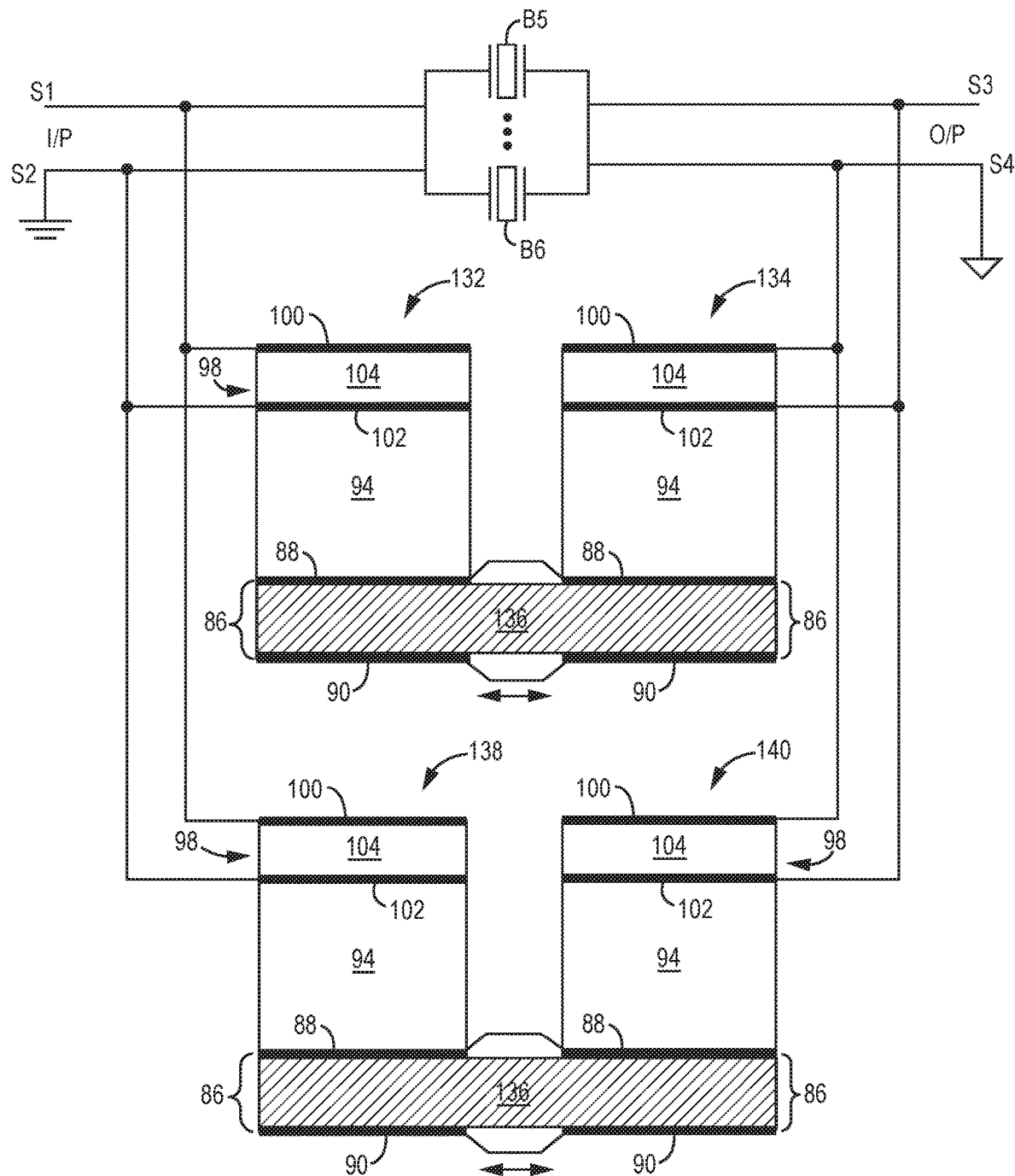
FIG. 36 is an eleventh embodiment of an acoustically coupled filter.

FIG. 36 illustrates an embodiment where the bottom transducers 86 of two CRFs 132, 134 are transversally acoustically coupled and the bottom transducers 86 of two CRFs 138, 140 are transversally acoustically coupled. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrodes 100 of the top transducers 98 of CRFs 132, 138 are coupled to terminal S1. The bottom electrodes 102 of the top transducers 98 of CRF 132, 138 are coupled to terminal S2. The top electrodes 100 of the top transducers 98 of CRF 134, 140 are coupled to terminal S4. The bottom electrodes 102 of the top transducers 98 of CRF 134, 140 are coupled to terminal S3. The top electrodes 88 of the bottom transducers 86 of CRFs 132, 134 are coupled to one another, and the bottom electrodes 90 of the bottom transducers 86 of CRFs 132, 134 are coupled to one another. The top electrodes 88 of the bottom transducers 86 of CRFs 138, 140 are coupled to one another, and the bottom electrodes 90 of the bottom transducers 86 of CRFs 138, 140 are coupled to one another.

In this embodiment, the bottom transducers 86 of CRFs 132, 134 are transversally acoustically coupled via a common piezoelectric layer 136. The top transducers 98 are not transversally acoustically coupled. In particular, the bottom transducer 86 of CRF 132 includes a portion (leftmost portion) of a piezoelectric layer 136 sandwiched between a top electrode 88 and a bottom electrode 90. The bottom transducer 86 of CRF 134 includes a portion (rightmost portion) of the same piezoelectric layer 136 sandwiched between a top electrode 88 and a bottom electrode 90.

Similarly, the bottom transducers 86 of CRFs 138, 140 are transversally acoustically coupled via a common piezoelectric layer 136. The top transducers 98 are not transversally acoustically coupled. In particular, the bottom transducer 86 of CRF 138 includes a portion (leftmost portion) of a piezoelectric layer 136 sandwiched between a top electrode 88 and a bottom electrode 90. The bottom transducer 86 of CRF 140 includes a portion (rightmost portion) of the same piezoelectric layer 136 sandwiched between a top electrode 88 and a bottom electrode 90.

As with previous embodiments, the series resonance frequencies for the various transducers 86, 98 of the CRFs 132, 134, 138, 140 may be the same or different, as well as combinations of same and different series resonance frequencies. For each CRF 132, 134, 138, 140 depending on the characteristics desired of the filter circuit, the series resonance frequencies of the top and bottom transducers 98, 86 may be the same or different. The series resonance frequencies for the top and bottom transducers 98, 86 may be different between the CRFs 132, 134, 138, 140. For example, the top and bottom transducers 98, 86 for CRF 132 may have a series resonance frequency of FS1, the top and bottom transducers 98, 86 for CRF 134 may have a series resonance frequency of FS2, the top and bottom transducers 98, 86 for CRF 138 may have a series resonance frequency of FS3, and the top and bottom transducers 98, 86 for CRF 140 may have a series resonance frequency of FS4, where FS1, FS2, FS3, and FS4 are unique series resonance frequencies. Alternatively, the top transducer 98 for one or more of the CRFs 132, 134, 138, 140 may have a different series resonance frequency.

Figure 37:
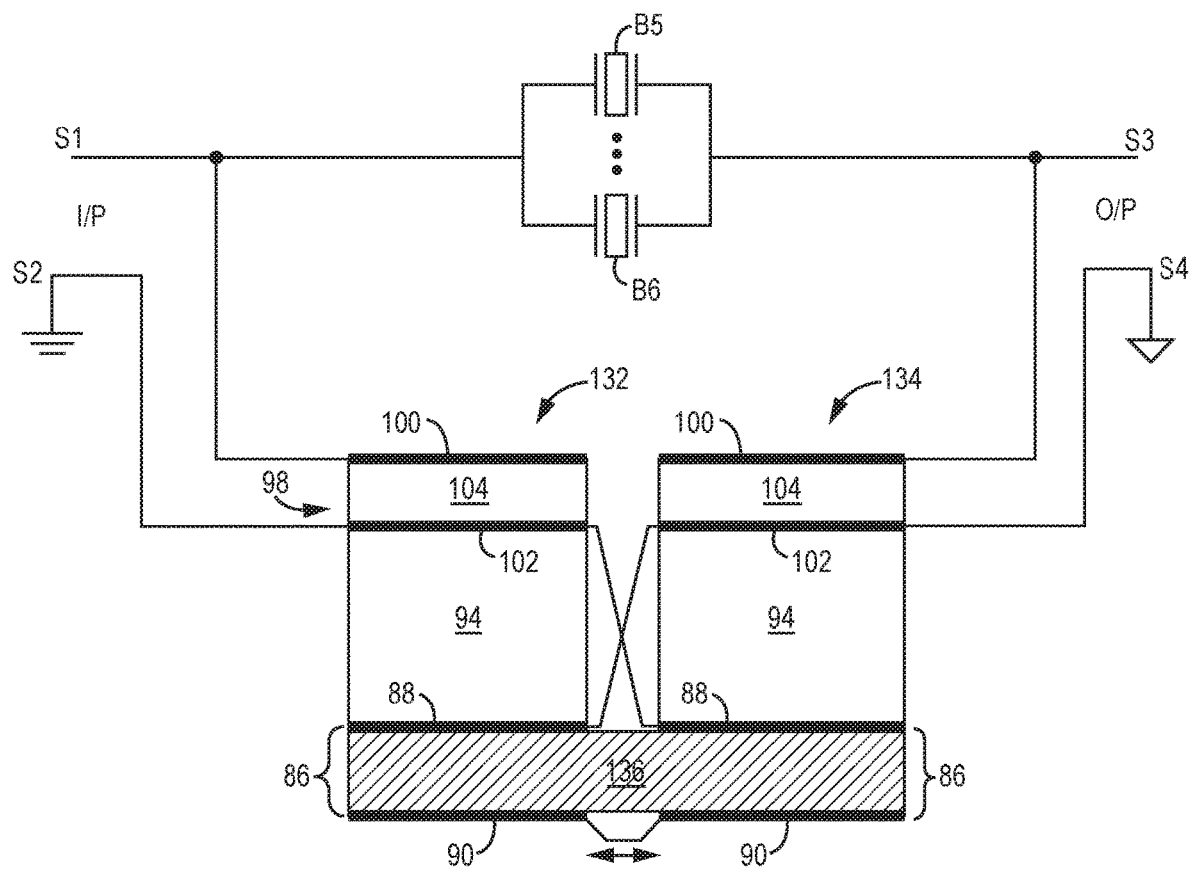
FIG. 37 is a twelfth embodiment of an acoustically coupled filter.

FIG. 37 illustrates an embodiment where transducers 86 of different CRFs 132, 134 are transversally acoustically coupled. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrode 100 of the top transducer 98 of CRF 132 is coupled to terminal S1. The bottom electrode 102 of the top transducer 98 of CRF 132 is coupled to terminal S2. The top electrode 100 of the top transducer 98 of CRF 134 is coupled to terminal S3. The bottom electrode 102 of the top transducer 98 of CRF 134 is coupled to terminal S4. The top electrode 88 of the bottom transducer 86 of CRF 132 is coupled to the bottom electrode 102 of the top transducer 98 of CRF 134. The bottom electrode 102 of the top transducer 98 of CRF 132 is coupled to the top electrode 88 of the bottom transducer 86 of CRF 134.

In this embodiment, the bottom transducers 86 of CRFs 132, 134 are transversally acoustically coupled via a common piezoelectric layer 136. The top transducers 98 are not transversally acoustically coupled. In particular, the bottom transducer 86 of CRF 132 includes a portion (leftmost portion) of a piezoelectric layer 136 sandwiched between a top electrode 88 and a bottom electrode 90. The bottom transducer 86 of CRF 134 includes a portion (rightmost portion) of the same piezoelectric layer 136 sandwiched between a top electrode 88 and a bottom electrode 90.

For each CRF 132, 134, depending on the characteristics desired of the filter circuit, the series resonance frequencies of the top and bottom transducers 98, 86 may be the same or different. The series resonance frequencies for the top and bottom transducers 98, 86 may be different between the CRFs 132, 134. For example, the resonance frequencies for the top and bottom transducers 98, 86 for both CRFs 132, 134 may all be the same. In another embodiment, the top and bottom transducers 98, 86 for CRF 132 may have a series resonance frequency of FS1, and the top and bottom transducers 98, 86 for CRF 134 may have a series resonance frequency of FS2, where FS1 is different than FS2. In another embodiment, the top and bottom transducers 98, 86 for both CRFs 132, 134 may have a series resonance frequency of FS1. Alternatively, the top transducer 98 for CRF 132 may have a series resonance frequency of FS1, the bottom transducer 86 for CRF 132 may have a series resonance frequency of FS2, the top transducer 98 for CRF 134 may have a series resonance frequency of FS3, and the bottom transducer 86 for CRF 134 may have a series resonance frequency of FS4, wherein FS1, FS2, FS3, and FS4 are unique series resonance frequencies.

Figure 38:
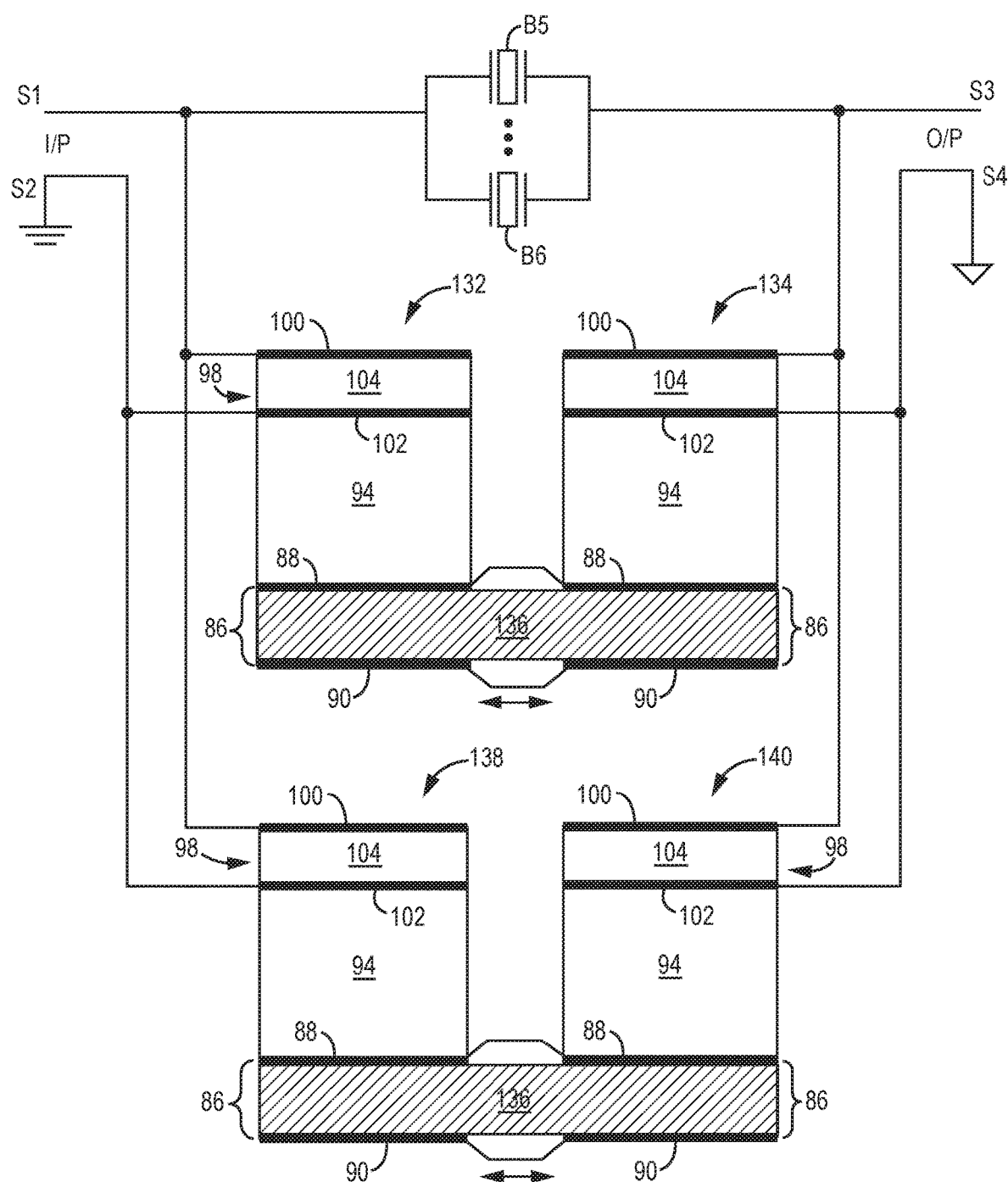
FIG. 38 is a thirteenth embodiment of an acoustically coupled filter.

FIG. 38 illustrates an embodiment where the bottom transducers 86 of two CRFs 132, 134 are transversally acoustically coupled and the bottom transducers 86 of two CRFs 138,140 are transversally acoustically coupled. An input signal VP is provided at terminals S1 and S2, and an output signal O/P is provided at terminals S3 and S4. One or more BAW resonators B5, B6 are provided in series between terminals S1 and S3 and parallel with one another. As illustrated, terminal S2 is coupled to a first signal ground, and terminal S4 is coupled to a second signal ground.

In particular, the top electrodes 100 of the top transducers 98 of CRFs 132, 138 are coupled to terminal S1. The bottom electrodes 102 of the top transducers 98 of CRF 132, 138 are coupled to terminal S2. The top electrodes 100 of the top transducers 98 of CRF 134, 140 are coupled to terminal S3. The bottom electrodes 102 of the top transducers 98 of CRF 134, 140 are coupled to terminal S4. The top electrodes 88 of the bottom transducers 86 of CRFs 132, 134 are coupled to one another, and the bottom electrodes 90 of the bottom transducers 86 of CRFs 132, 134 are coupled to one another. The top electrodes 88 of the bottom transducers 86 of CRFs 138, 140 are coupled to one another, and the bottom electrodes 90 of the bottom transducers 86 of CRFs 138, 140 are coupled to one another.

In this embodiment, the bottom transducers 86 of CRFs 132, 134 are transversally acoustically coupled via a common piezoelectric layer 136. The top transducers 98 are not transversally acoustically coupled. In particular, the bottom transducer 86 of CRF 132 includes a portion (leftmost portion) of a piezoelectric layer 136 sandwiched between a top electrode 88 and a bottom electrode 90. The bottom transducer 86 of CRF 134 includes a portion (rightmost portion) of the same piezoelectric layer 136 sandwiched between a top electrode 88 and a bottom electrode 90.

Similarly, the bottom transducers 86 of CRFs 138, 140 are transversally acoustically coupled via a common piezoelectric layer 136. The top transducers 98 are not transversally acoustically coupled. In particular, the bottom transducer 86 of CRF 138 includes a portion (leftmost portion) of a piezoelectric layer 136 sandwiched between a top electrode 88 and a bottom electrode 90. The bottom transducer 86 of CRF 140 includes a portion (rightmost portion) of the same piezoelectric layer 136 sandwiched between a top electrode 88 and a bottom electrode 90.

As with previous embodiments, the series resonance frequencies for the various transducers 86, 98 of the CRFs 132, 134, 138, 140 may be the same or different, as well as combinations of same and different series resonance frequencies. For each CRF 132, 134, 138, 140 depending on the characteristics desired of the filter circuit, the series resonance frequencies of the top and bottom transducers 98, 86 may be the same or different. The series resonance frequencies for the top and bottom transducers 98, 86 may be different between the CRFs 132, 134, 138, 140. For example, the top and bottom transducers 98, 86 for CRF 132 may have a series resonance frequency of FS1, the top and bottom transducers 98, 86 for CRF 134 may have a series resonance frequency of FS2, the top and bottom transducers 98, 86 for CRF 138 may have a series resonance frequency of FS3, and the top and bottom transducers 98, 86 for CRF 140 may have a series resonance frequency of FS4, where FS1, FS2, FS3, and FS4 are unique series resonance frequencies. Alternatively, the top transducer 98 for one or more of the CRFs 80, 106, 110, 112 may have a different series resonance frequency.

Figure 39:
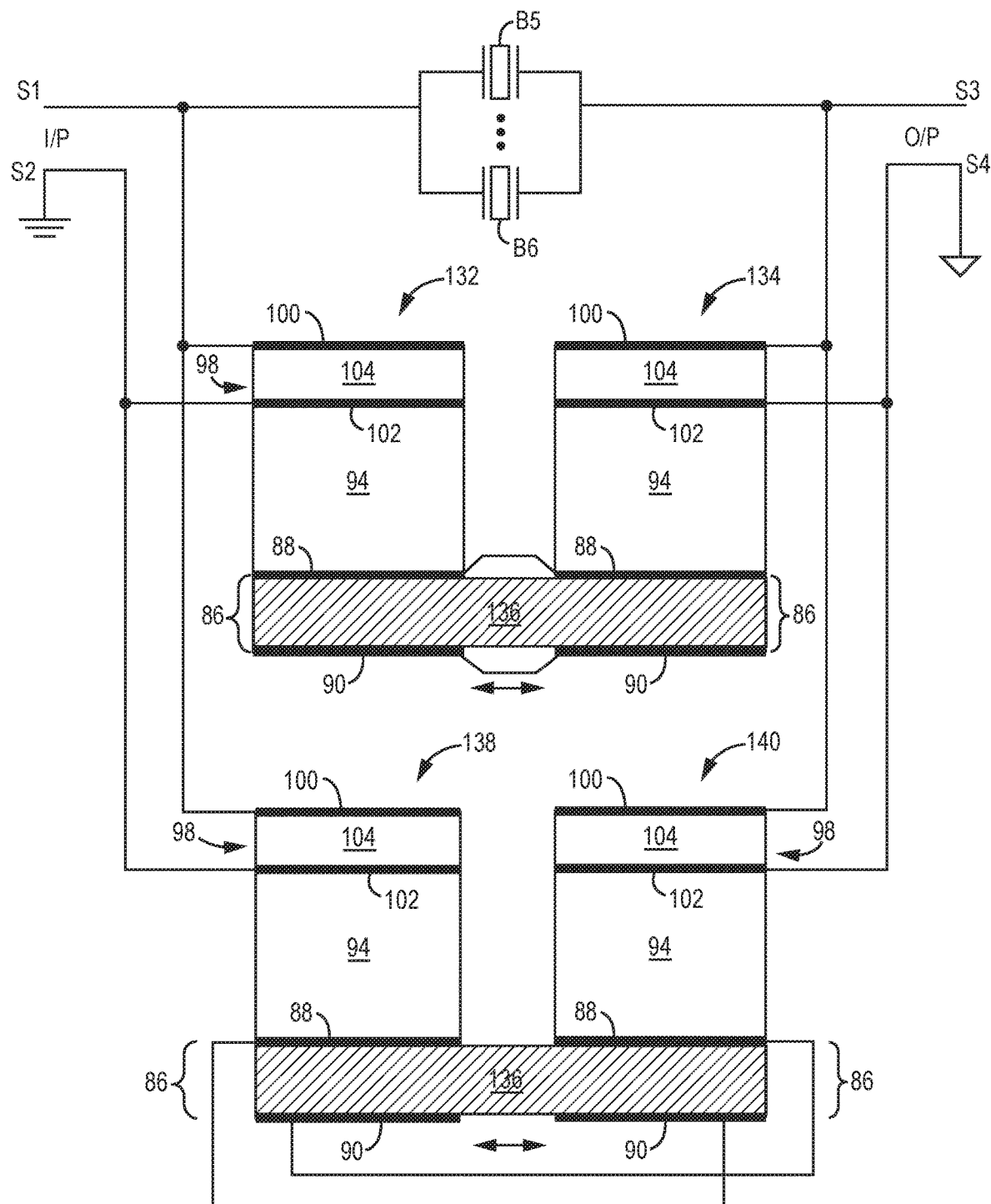
FIG. 39 is a fourteenth embodiment of an acoustically coupled filter.

A variant on the embodiment of FIG. 38 is provided in FIG. 39. The difference is that the top electrode 88 of the bottom transducer 86 of CRF 138 is coupled to the bottom electrode 90 of the bottom transducer 86 of CRF 140. Further, the bottom electrode 90 of the bottom transducer 86 of CRF 138 is coupled to the top electrode 88 of the bottom transducer 86 of CRF 140. As such, the location of inversion may vary from one embodiment to another, and certain embodiments need not provide an inversion depending on the application. For any of the embodiments described above, the series resonance frequencies of the BAW resonators B5, B6 may be different from that for the CRFs 80, etc.

While the concepts disclosed herein are described in association with a mobile terminal, these concepts are applicable to any type of communication device that employs wireless communications. Those skilled in the art will recognize numerous modifications and other embodiments that incorporate the concepts described herein. These modifications and embodiments are considered to be within scope of the teachings provided herein and the claims that follow.

What is claimed is:

1. A filter circuit comprising:
    a first input node and a second input node for receiving an input signal;
    a first output node and a second output node for providing an output signal;
    a first series acoustic resonator coupled in series between the first input node and the first output node; and
    at least one coupled resonator filter (CRF) comprising:
        a first transducer having a first electrode coupled to the first input node, a second electrode coupled to the second input node, and a first piezoelectric layer between the first electrode and the second electrode; and
        a second transducer having a third electrode coupled to the first output node, a fourth electrode coupled to the second output node, and a second piezoelectric layer between the third electrode and the fourth electrode.

2. The filter circuit of claim 1 wherein the at least one CRF comprises a first CRF that comprises the first transducer, the second transducer, and a first coupling structure between the first transducer and the second transducer, wherein the first transducer and the second transducer are vertically aligned such that the first coupling structure vertically acoustically couples the first transducer and the second transducer.

3. The filter circuit of claim 2 wherein a series resonance frequency of the first transducer is about the same as a series resonance frequency of the second transducer.

4. The filter circuit of claim 3 wherein a series resonance frequency of the first series acoustic resonator is different than the series resonance frequency of the first transducer and the series resonance frequency of the second transducer.

5. The filter circuit of claim 2 wherein a series resonance frequency of the first transducer is different from a series resonance frequency of the second transducer.

6. The filter circuit of claim 5 wherein a series resonance frequency of the first series acoustic resonator is different than the series resonance frequency of the first transducer and the series resonance frequency of the second transducer.

7. The filter circuit of claim 2 wherein the at least one CRF further comprises a second CRF that comprises:
a third transducer having a fifth electrode coupled to the first input node, a sixth electrode coupled to the second input node, and a third piezoelectric layer between the fifth electrode and the sixth electrode;
a fourth transducer having a seventh electrode coupled to the first output node, an eighth electrode coupled to the second output node, and a fourth piezoelectric layer between the seventh electrode and the eighth electrode; and
a second coupling structure between the third transducer and the fourth transducer, wherein the third transducer and the fourth transducer are vertically aligned such that the second coupling structure vertically acoustically couples the third transducer and the fourth transducer.

8. The filter circuit of claim 7 wherein the first electrode is coupled to the fifth electrode, the second electrode is coupled to the sixth electrode, the third electrode is coupled to the seventh electrode, and the fourth electrode is coupled to the eighth electrode.

9. The filter circuit of claim 8 wherein a series resonance frequency of the first transducer is about the same as a series resonance frequency of the second transducer, and a series resonance frequency of the third transducer is about the same as a series resonance frequency of the fourth transducer.

10. The filter circuit of claim 9 wherein a series resonance frequency of the first series acoustic resonator is different than the series resonance frequency of the first transducer and the series resonance frequency of the third transducer.

11. The filter circuit of claim 8 wherein the first transducer, the second transducer, the third transducer, and the fourth transducer have about the same series resonance frequency.

12. The filter circuit of claim 11 wherein a series resonance frequency of the first series acoustic resonator is different than the series resonance frequency of the first transducer and the series resonance frequency of the third transducer.

13. The filter circuit of claim 8 wherein the first transducer, the second transducer, the third transducer, and the fourth transducer have different series resonance frequencies.

14. The filter circuit of claim 13 wherein a series resonance frequency of the first series acoustic resonator is different than the series resonance frequency of the first transducer and the series resonance frequency of the second transducer.

15. The filter circuit of claim 7 wherein a series resonance frequency of the first series acoustic resonator is different than a series resonance frequency of the first transducer and a series resonance frequency of the second transducer.

16. The filter circuit of claim 7 wherein a series resonance frequency of the first transducer is about the same as a series resonance frequency of the second transducer, and a series resonance frequency of the third transducer is about the same as a series resonance frequency of the fourth transducer.

17. The filter circuit of claim 1 wherein the at least one CRF comprises a plurality of CRFs that provides a path between at least one of the first and second input nodes and at least one of the first and second output nodes, such that at least a portion of the path includes a portion that is vertically acoustically coupled within one or more of the plurality of CRFs.

18. The filter circuit of claim 1 wherein:
the at least one CRF comprises a first CRF that comprises the first transducer and a second CRF that comprises the second transducer; and
the first CRF is coupled to the second CRF.

19. The filter circuit of claim 18 wherein:
the first CRF comprises the first transducer, a third transducer, and a first coupling structure between the first transducer and the third transducer, such that the first transducer and the third transducer are vertically aligned such that the first coupling structure vertically acoustically couples the first transducer and the third transducer;
the second CRF comprises the second transducer, a fourth transducer, and a second coupling structure between the second transducer and the fourth transducer, such that the second transducer and the fourth transducer are vertically aligned such that the second coupling structure vertically acoustically couples the second transducer and the fourth transducer;
the third transducer has a fifth electrode, a sixth electrode, and a first portion of a third piezoelectric layer between the fifth electrode and the sixth electrode; and
the fourth transducer has a seventh electrode, an eighth electrode, and a second portion of the third piezoelectric layer, which is transversally acoustically coupled to the first portion of the third piezoelectric layer.

20. The filter circuit of claim 19 wherein the fifth electrode is coupled to the seventh electrode and the sixth electrode is coupled to the eighth electrode.

21. The filter circuit of claim 20 wherein in the first CRF, the fifth electrode is over the sixth electrode, and in the second CRF, the seventh electrode is over the eighth electrode.

22. The filter circuit of claim 21 wherein the fourth electrode is over the third electrode.

23. The filter circuit of claim 19 wherein in the first CRF, the fifth electrode is over the sixth electrode, and in the second CRF, the eighth electrode is over the seventh electrode.

24. The filter circuit of claim 23 wherein the third electrode is over the fourth electrode.

25. The filter circuit of claim 19 wherein the second electrode is coupled to the seventh electrode, the fourth electrode is coupled to the fifth electrode, and the sixth electrode is coupled to the eighth electrode.

26. The filter circuit of claim 25 wherein in the first CRF, the fifth electrode is over the sixth electrode, and in the second CRF, the seventh electrode is over the eighth electrode.

27. The filter circuit of claim 26 wherein the third electrode is over the fourth electrode.

28. The filter circuit of claim 1 wherein:
the at least one CRF comprises a first CRF that comprises the first transducer and a second CRF that comprises the second transducer; and
the first CRF is transversally acoustically coupled to the second CRF.

29. The filter circuit of claim 1 wherein the first series acoustic resonator is a bulk acoustic wave resonator.

* * * * *